United States Patent
Lee et al.

(10) Patent No.: US 11,963,399 B2
(45) Date of Patent: Apr. 16, 2024

(54) DISPLAY DEVICE WITH PIXEL ELECTRODE HAVING OPENING OVERLAPPING PIXEL DRIVER

(71) Applicant: Samsung Display Co., LTD., Yongin-si (KR)

(72) Inventors: Kwang Soo Lee, Gwangmyeong-si (KR); Seul-Ki Kim, Incheon (KR); Seung Rae Kim, Cheonan-si (KR); Jae Hyun Lee, Gwacheon-si (KR); Ki Su Jin, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 413 days.

(21) Appl. No.: 17/349,506

(22) Filed: Jun. 16, 2021

(65) Prior Publication Data

US 2022/0140036 A1    May 5, 2022

(30) Foreign Application Priority Data

Oct. 29, 2020    (KR) ........................ 10-2020-0142037

(51) Int. Cl.
*H10K 59/121*    (2023.01)
*G09G 3/3225*    (2016.01)
*H10K 59/122*    (2023.01)
*H10K 59/131*    (2023.01)

(52) U.S. Cl.
CPC ....... *H10K 59/1213* (2023.02); *G09G 3/3225* (2013.01); *H10K 59/122* (2023.02); *H10K 59/131* (2023.02)

(58) Field of Classification Search
CPC ............. H10K 59/1213; H10K 59/131; H10K 59/122; G09G 3/3225
See application file for complete search history.

(56) References Cited

U.S. PATENT DOCUMENTS

| 7,067,973 | B2 | 6/2006 | Murakami et al. | |
| 7,692,191 | B2 | 4/2010 | Kwak et al. | |
| 8,039,841 | B2 * | 10/2011 | Park | H10K 59/123 |
| | | | | 438/34 |
| 8,120,249 | B2 | 2/2012 | Choi et al. | |
| 2005/0258744 | A1 * | 11/2005 | Kwak | H10K 59/128 |
| | | | | 313/504 |

(Continued)

FOREIGN PATENT DOCUMENTS

| JP | 5386994 | 1/2014 |
| KR | 10-2017-0045428 | 4/2017 |

*Primary Examiner* — Lex H Malsawma
(74) *Attorney, Agent, or Firm* — KILE PARK REED & HOUTTEMAN PLLC

(57) ABSTRACT

A display device includes a substrate including pixels including a first pixel and a second pixel, a driver of the first pixel disposed on the substrate, a driver of the second pixel disposed on the substrate, a first pixel electrode overlapping the driver of the first pixel and electrically connected to the driver of the first pixel, a second pixel electrode overlapping the driver of the first pixel and the driver of the second pixel and electrically connected to the driver of the second pixel, an emission layer disposed on the first pixel electrode and the second pixel electrode, and a common electrode disposed on the emission layer, wherein the second pixel electrode includes a first opening overlapping the driver of the first pixel.

20 Claims, 19 Drawing Sheets

(56) References Cited

U.S. PATENT DOCUMENTS

2006/0170634 A1\* 8/2006 Kwak .................. H10K 59/126
  345/92
2013/0069067 A1 3/2013 Youn
2017/0352312 A1 12/2017 Ebisuno et al.

\* cited by examiner

DISPLAY DEVICE WITH PIXEL ELECTRODE HAVING OPENING OVERLAPPING PIXEL DRIVER

CROSS-REFERENCE TO RELATED APPLICATION(S)

This application claims priority to and benefits of Korean Patent Application No. 10-2020-0142037 under 35 U.S.C. § 119, filed in the Korean Intellectual Property Office on Oct. 29, 2020, the entire contents of which are incorporated herein by reference.

BACKGROUND

1. Technical Field

The disclosure relates to a display device.

2. Description of the Related Art

An organic light emitting diode (OLED) display device may include two electrodes and an organic light emitting layer interposed therebetween, wherein electrons injected from an electrode and holes injected from another electrode may be combined in the organic light emitting layer to generate excitons. The generated excitons may be changed to a ground state from an excited state, releasing energy to emit light.

Such an organic light emitting diode display device may include pixels including an organic light emitting diode which may be a self-emissive device. In each pixel, transistors for driving the organic light emitting diode and at least one capacitor may be formed. The transistors may include a switching transistor and a driving transistor. The organic light emitting diode may be positioned on the transistor. That is, a light emitting part and a driver may be disposed so as to vertically overlap each other. In this case, the organic light emitting diode may include a pixel electrode, an emission layer, and a common electrode, and the pixel electrode may be made of a highly reflective metallic material. Light generated by the organic light emitting diode may be reflected by the pixel electrode to emit light to an upper surface of a display device, and this may be referred to as a top emission type.

In a top emission type of display device, a transistor and an organic light emitting diode may be disposed to overlap each other, and thus, the top emission type display device may be more advantageous in a high resolution design compared to a bottom emission type of display device. However, as the transistor and the organic light emitting diode overlap each other, parasitic capacitance may be formed, and thus luminance of some pixels may be deteriorated. Low gray may increase such a luminance deteriorated phenomenon.

The above information disclosed in this Background section is only for enhancement of understanding of the background of the described technology, and therefore it may contain information that does not form the prior art that is already known in this country to a person of ordinary skill in the art.

SUMMARY

Embodiments provide a display device that may prevent luminance from being deteriorated due to parasitic capacitance.

An embodiment provides a display device that may include a substrate including pixels including a first pixel and a second pixel, a driver of the first pixel disposed in the substrate, a driver of the second pixel disposed on the substrate, a first pixel electrode overlapping the driver of the first pixel and electrically connected to the driver of the first pixel, a second pixel electrode overlapping the driver of the first pixel and the driver of the second pixel and electrically connected to the driver of the second pixel, an emission layer disposed on the first pixel electrode and the second pixel electrode, and a common electrode disposed on the emission layer, wherein the second pixel electrode includes a first opening overlapping the driver of the first pixel.

A driver of each of the pixels may include a driving transistor, and a switching transistor electrically connected to the driving transistor, and the first opening of the second pixel electrode may overlap the driving transistor of the first pixel.

The display device may further include a driving voltage line disposed on the substrate, a first data line disposed on the substrate, and a second data line disposed on the substrate, wherein the driving transistor of the first pixel and the driving transistor of the second pixel may be electrically connected to the driving voltage line, the switching transistor of the first pixel may be electrically connected to the first data line, and the switching transistor of the second pixel may be electrically connected to the second data line.

The pixels may further include a third pixel, the display device may further include a driver of the third pixel disposed on the substrate, and a third pixel electrode electrically connected to the driver of the third pixel, the second pixel electrode may overlap the driver of the third pixel, and the second pixel electrode may include a second opening overlapping the driving transistor of the third pixel.

The second pixel electrode may further include a third opening overlapping the driving transistor of the second pixel.

The display device may further include a passivation film disposed on the driving transistor of the first pixel and the driving transistor of the second pixel, and a pixel defining layer disposed on the first pixel electrode, the second pixel electrode, and the passivation film, wherein the pixel defining layer includes a pixel opening overlapping the first pixel electrode and the second pixel electrode.

The pixel defining layer may be disposed within the opening.

The pixel defining layer may not overlap the opening.

The pixel defining layer may include a first portion overlapping the opening, and a second portion excluding the first portion, and a thickness of the first portion may be greater than a thickness of the second portion.

The driving transistor of each of the pixels may include a semiconductor layer disposed on the substrate and including a first region, a channel, and a second region, and a gate electrode overlapping the channel of the semiconductor layer, and the display device may further include a lower storage electrode extending from the gate electrode of the driving transistor, and an upper storage electrode disposed on the lower storage electrode, overlapping the lower storage electrode, and electrically connected to the second region of the semiconductor layer of the driving transistor.

The upper storage electrode may overlap the second region of the semiconductor layer of the driving transistor.

The upper storage electrode may overlap the gate electrode of the driving transistor.

The display device may further include a passivation film disposed on the driving transistor of the first pixel and the driving transistor of the second pixel, and a pixel defining layer disposed on the first pixel electrode, the second pixel electrode, and the passivation film, wherein the pixel defining layer includes a pixel opening overlapping the first pixel electrode and the second pixel electrode.

The pixel defining layer may be disposed within the opening.

The pixel defining layer may include a first portion overlapping the opening, and a second portion excluding the first portion, and a thickness of the first portion may be greater than a thickness of the second portion.

The first pixel and the second pixel may display different colors.

Another embodiment provides a display device that may include a substrate including pixels including a first pixel and a second pixel, a driver of the first pixel disposed on the substrate, a driver of the second pixel that disposed on the substrate, a passivation film disposed on the driver of the first pixel and the driver of the second pixel, a first pixel electrode disposed on the passivation film, overlapping the driver of the first pixel, and electrically connected to the driver of the first pixel, a second pixel electrode disposed on the passivation film, overlapping the driver of the first pixel and the driver of the second pixel, and electrically connected to the driver of the second pixel, an emission layer disposed on the first pixel electrode and the second pixel electrode, and a common electrode disposed on the emission layer, wherein the passivation film may include a first portion disposed between the driver of the first pixel and the second pixel electrode, and a second portion excluding the first portion, and a thickness of the first portion may be greater than a thickness of the second portion.

A driver of each of the pixels may include a driving transistor and a switching transistor connected to the driving transistor, and the first portion of the passivation film may be disposed between the driving transistor of the first pixel electrode and the second pixel electrode.

The driving transistor of each of the pixels may include a semiconductor layer disposed on the substrate and including a first region, a channel, and a second region, and a gate electrode overlapping the channel of the semiconductor layer, and the display device may further include a lower storage electrode extending from the gate electrode of the driving transistor, and an upper storage electrode disposed on the lower storage electrode, overlapping the lower storage electrode, and electrically connected to the second region of the semiconductor layer of the driving transistor.

The upper storage electrode may overlap the gate electrode of the driving transistor.

According to embodiments, it may be possible to prevent luminance of a pixel from being deteriorated by reducing parasitic capacitance between a pixel electrode of a pixel of a display device and a driving transistor of another pixel thereof.

DETAILED DESCRIPTION OF THE EMBODIMENTS

Figure 1:
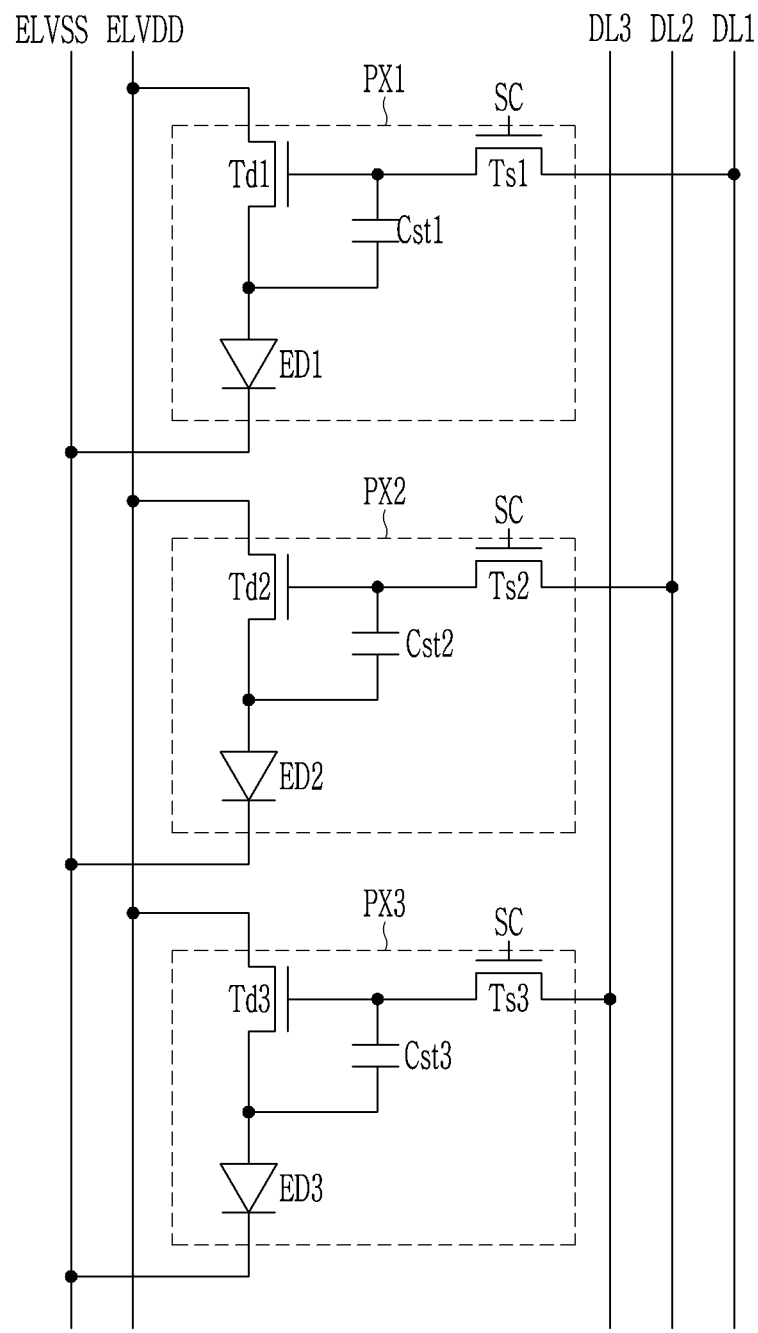
FIG. 1 schematically illustrates a circuit of a display device according to an embodiment.

Embodiments will be described more fully hereinafter with reference to the accompanying drawings. As those skilled in the art would realize, the described embodiments may be modified in various different ways, all without departing from the spirit or scope of the disclosure.

In order to clearly describe the embodiments, parts that may be irrelevant to the description may be omitted, and identical or similar constituent elements throughout the specification are denoted by the same reference numerals.

Further, in the drawings, the size and thickness of each element may be arbitrarily illustrated for ease of description, and the disclosure is not necessarily limited to those illustrated in the drawings.

As used herein, the singular forms, "a," "an," and "the" are intended to include the plural forms as well (and vice versa), unless the context clearly indicates otherwise.

It will be understood that when an element such as a layer, film, region, area or substrate is referred to as being "on" another element, it can be directly on the other element or intervening elements may also be present. In contrast, when an element is referred to as being "directly on" another element, there may be no intervening elements present. Further, in the specification, the word "on" or "above" means positioned on or below the object portion, and does not necessarily mean positioned on the upper side of the object portion based on a gravitational direction.

In addition, unless explicitly described to the contrary, the words "comprise", "has", "have", and "include", and variations such as "comprises", "comprising", "having", "includes", and "including" will be understood to imply the inclusion of stated elements but not the exclusion of any other elements.

Further, the phrase "in a plan view" or "on a plane" means viewing a target portion from the top, and the phrase "in a cross-sectional view" or "on a cross-section" means viewing a cross-section formed by vertically cutting a target portion from the side.

It will be understood that the terms "connected to" or "coupled to" may include a physical or electrical connection or coupling.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. When an element is described as "not overlapping" or "to not overlap" another element, this may include that the elements are spaced apart from each other, offset from each other, or set aside from each other or any other suitable term as would be appreciated and understood by those of ordinary skill in the art.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

First, a display device according to an embodiment will be described with reference to FIG. 1.

FIG. 1 schematically illustrates a circuit of a display device according to an embodiment. A display device according to an embodiment may include pixels. FIG. 1 illustrates three adjacent pixels.

As shown in FIG. 1, the pixels may include a first pixel PX1, a second pixel PX2, and a third pixel PX3. The first pixel PX1, the second pixel PX2, and the third pixel PX3 may include driving transistors Td1, Td2, and Td3, switching transistors Ts1, Ts2, and Ts3, capacitors Cst1, Cst2, and Cst3, and at least one light emitting diode ED1, ED2, and ED3, which may be light emitting elements, respectively. The pixels PX1, PX2, and PX3 may include drivers PXD1, PXD2, and PXD3, and light emitting parts, respectively. The driving transistors Td1, Td2, and Td3, the switching transistors Ts1, Ts2, and Ts3, and the capacitors Cst1, Cst2, and Cst3 of respective pixels PX1, PX2, and PX3 may configure the drivers PXD1, PXD2, and PXD3. The light emitting diodes ED1, ED2, and ED3 of respective pixels PX1, PX2, and PX3 may configure respective light emitting parts. A first electrode and a second electrode to be described below may be for classifying electrodes positioned at respective sides of a channel of each transistor, and may be a source electrode or a drain electrode.

A gate electrode of each of the driving transistors Td1, Td2, and Td3 of respective pixels PX1, PX2, and PX3 may be connected to an end of each of the capacitors Cst1, Cst2, and Cst3 and the second electrode of each of the switching transistors Ts1, Ts2, and Ts3. The first electrode of each of the driving transistors Td1, Td2, and Td3 may be connected to a driving voltage line that transmits a driving voltage ELVDD, and the second electrode of each of the driving transistors Td1, Td2, and Td3 may be connected to an anode of each of the light emitting diodes ED1, ED2, and ED3 and the other end of each of the capacitors Cst1, Cst2, and Cst3. The driving transistors Td1, Td2, and Td3 may receive data voltages DL1, DL2, and DL3 according to switching operations of the switching transistors Ts1, Ts2, and Ts3 to supply a driving current to the light emitting diodes ED1, ED2, and ED3 according to the voltage stored in the capacitors Cst1, Cst2, and Cst3.

A gate electrode of each of the switching transistors Ts1, Ts2, and Ts3 of respective pixels PX1, PX2, and PX3 may be connected to a scan line transmitting a scan signal SC, a first electrode of each of the switching transistors Ts1, Ts2, and Ts3 may be connected to a data line that may transmit the data voltages DL1, DL2, and DL3, and a second electrode of each of the switching transistors Ts1, Ts2, and Ts3 may be connected to an end of each of the capacitors Cst1, Cst2, and Cst3 and the gate electrode of each of the driving transistors Td1, Td2, and Td3. Data lines may transmit different data voltages DL1, DL2, and DL3. The switching transistors Ts1, Ts2, and Ts3 of respective pixels PX1, PX2, and PX3 may be connected to different data lines. The switching transistors Ts1, Ts2, and Ts3 may be turned on according to the scan signal SC to transmit the data voltages DL1, DL2, and DL3 to the gate electrodes of the driving transistors Td1, Td2, and Td3 and an end of the capacitors Cst1, Cst2, and Cst3.

An end of each of the capacitors Cst1, Cst2, and Cst3 may be connected to the gate electrode of each of the driving transistors Td1, Td2, and Td3, and another end thereof may be connected to the second electrode of each of the driving transistors Td1, Td2, and Td3 and the anode of each of the light emitting diodes ED1, ED2, and ED3. The cathodes of the light emitting diodes ED1, ED2, and ED3 may be connected to a common voltage line that transmits a common voltage ELVSS.

The light emitting diodes ED1, ED2, and ED3 may emit light with luminance according to driving currents generated by the driving transistors Td1, Td2, and Td3.

Hereinafter, a detailed structure of a display device according to an embodiment will be described with reference to FIG. 2 to FIG. 7 together with FIG. 1.

Figure 2:
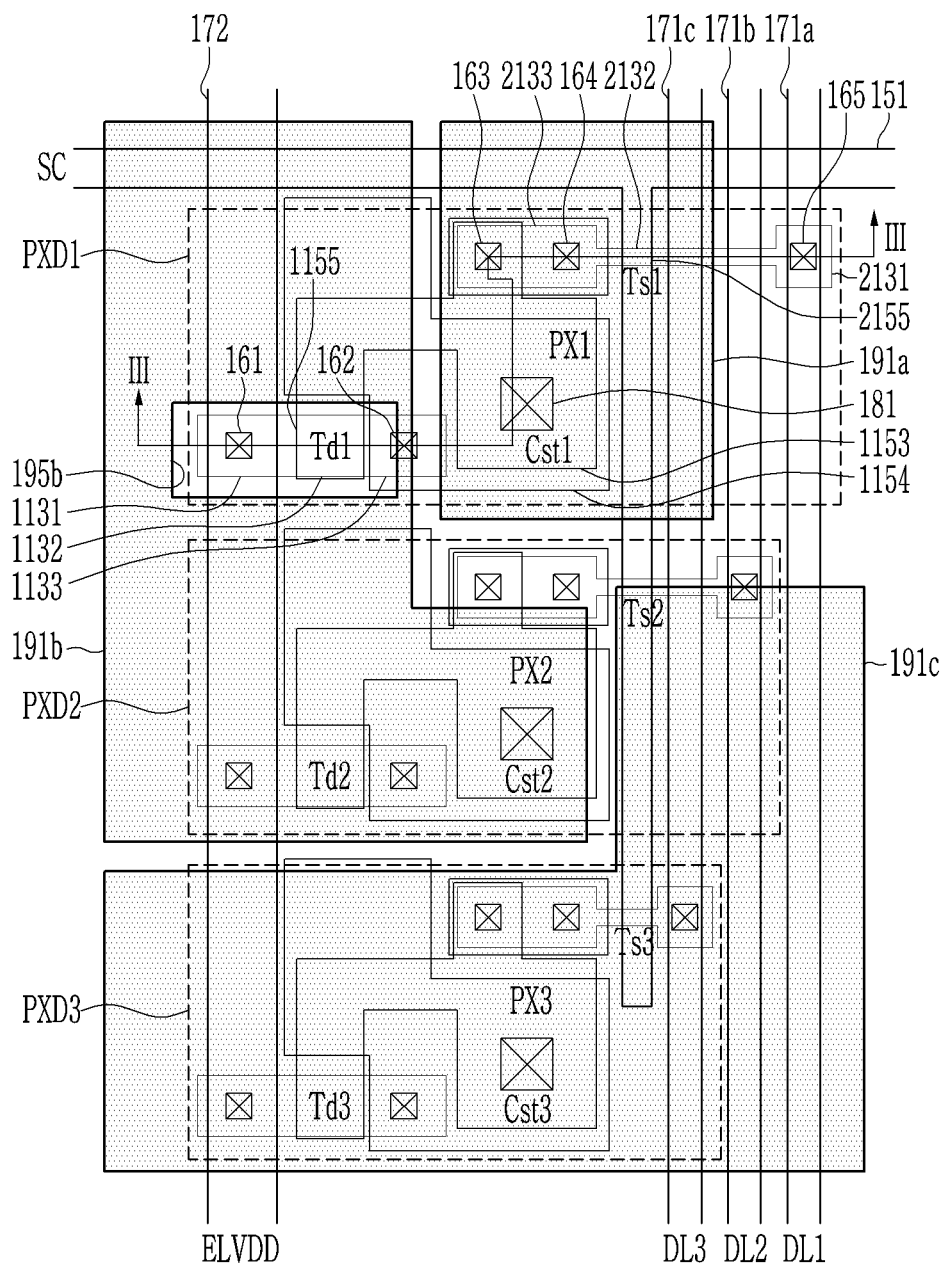
FIG. 2 schematically illustrates a plan view of a display device according to an embodiment.
Figure 3:
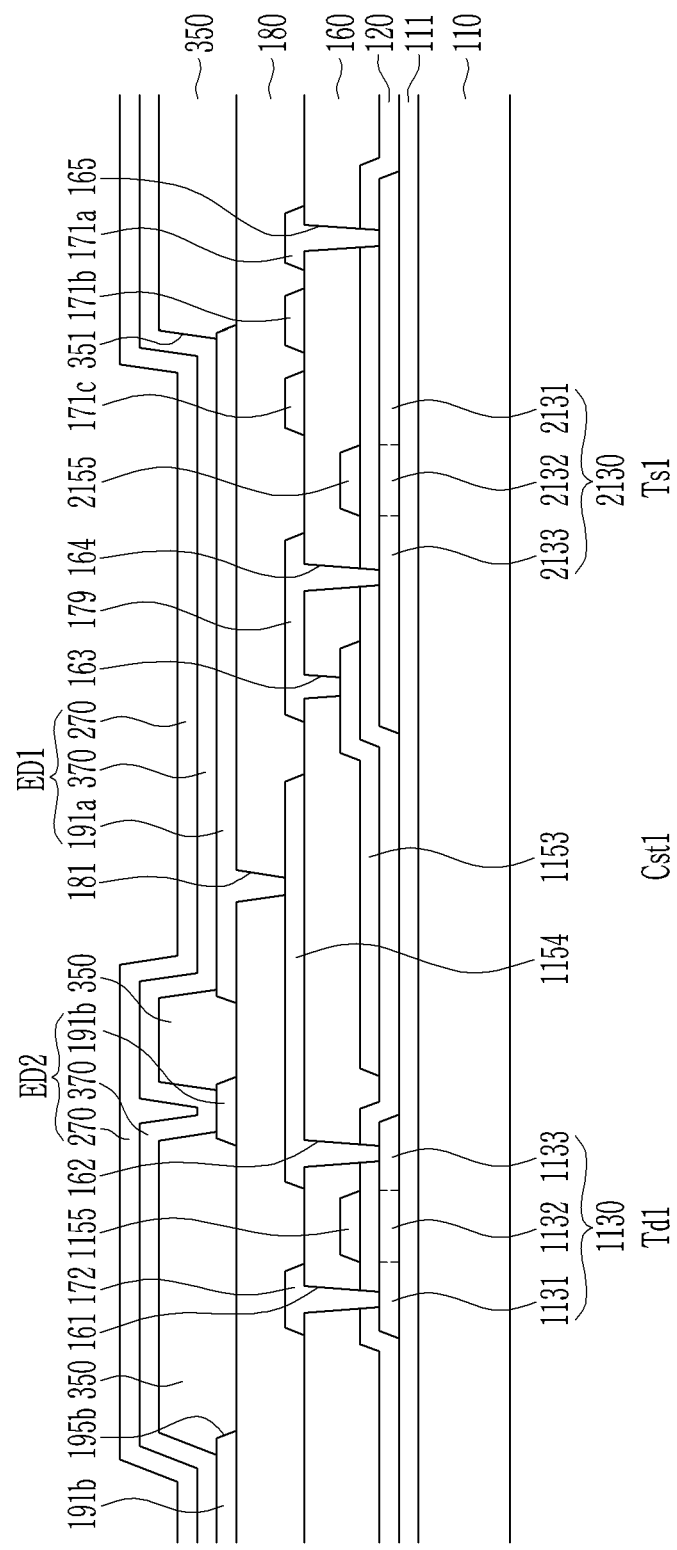
FIG. 3 schematically illustrates a cross-sectional view of a display device taken along line III-III of FIG. 2.
Figure 4:
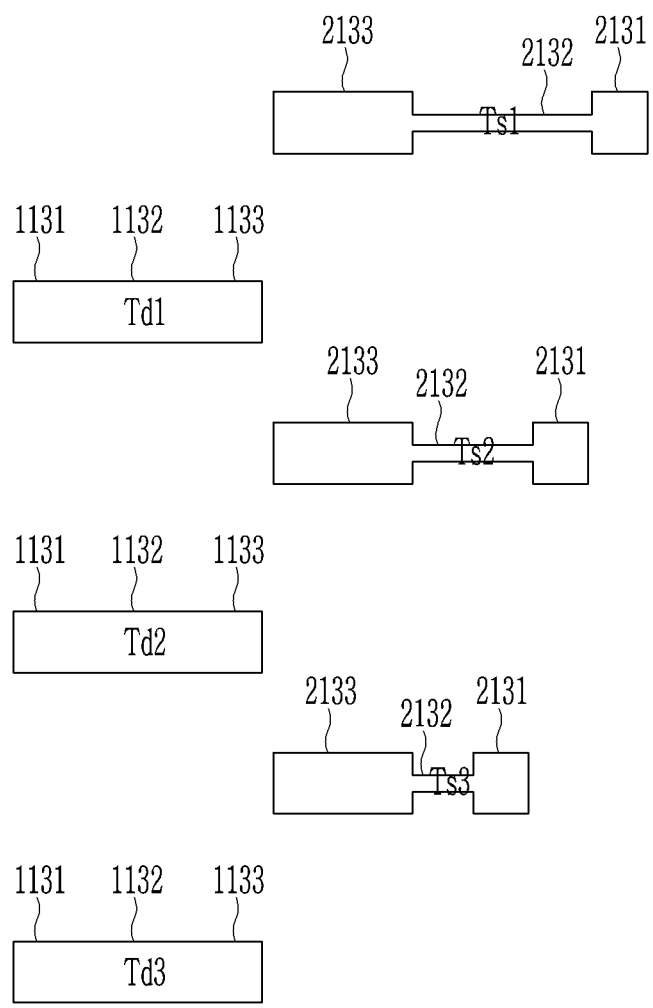
FIG. 4 to FIG. 7 schematically illustrate plan views of some layers of FIG. 2, which schematically illustrates a plan view of a display device according to an embodiment.
Figure 5:
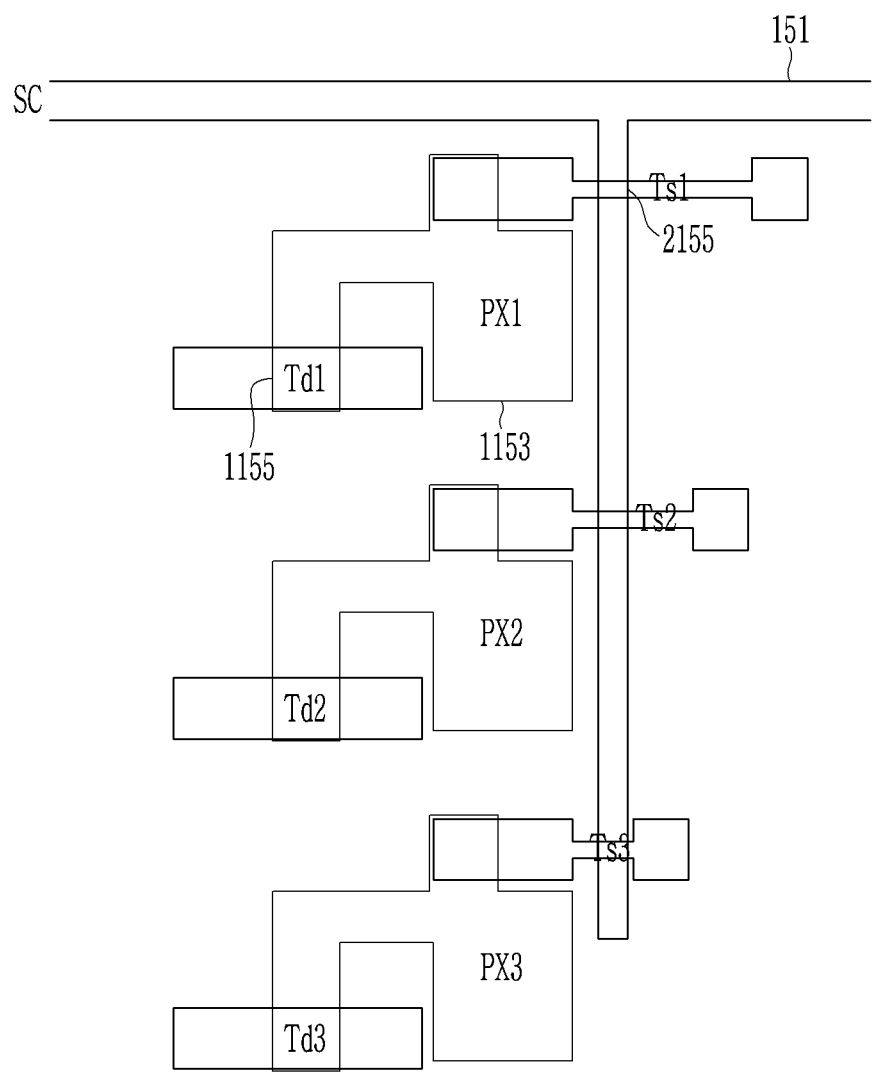
Figure 6:
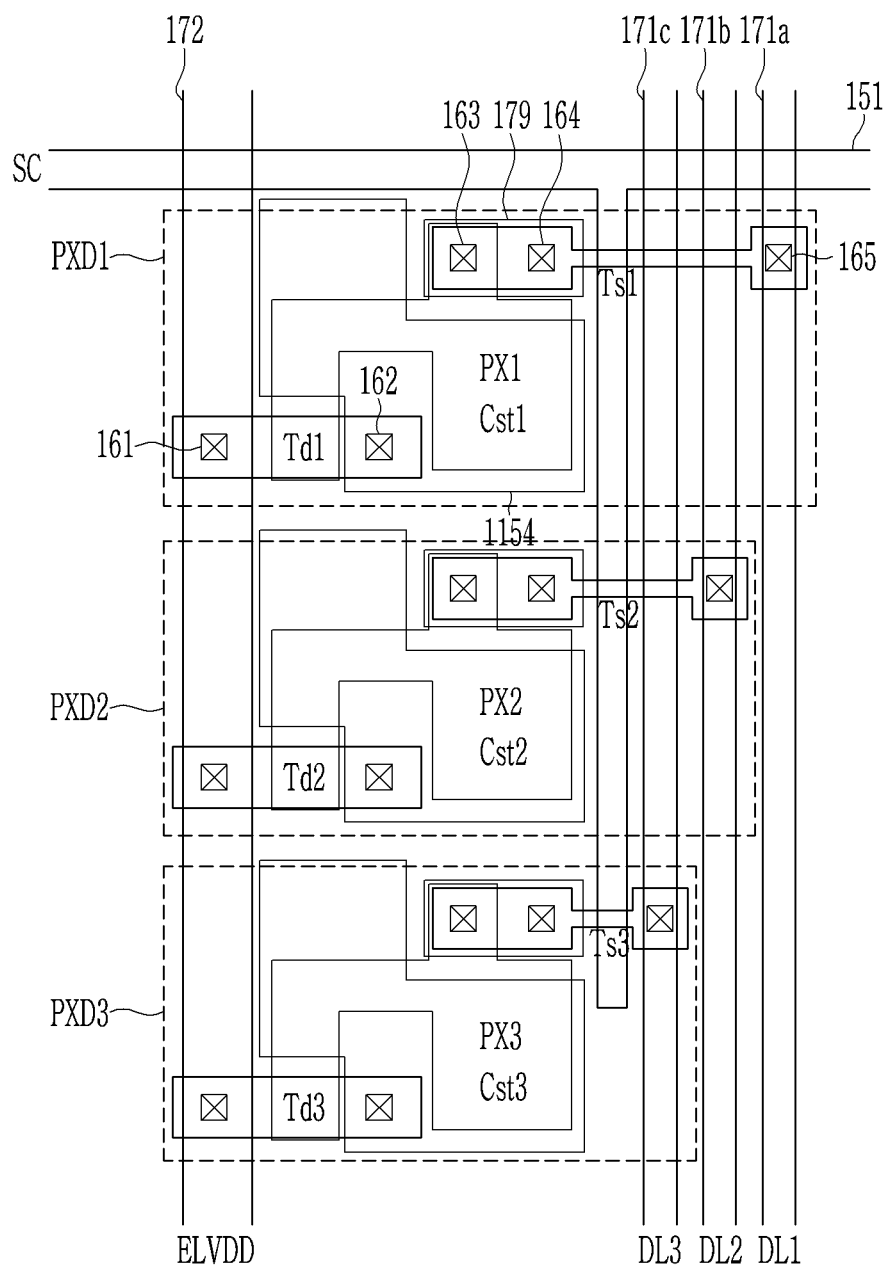

FIG. 2 schematically illustrates a plan view of a display device according to an embodiment, and FIG. 3 schematically illustrates a cross-sectional view of a display device taken along line of FIG. 2. FIG. 4 to FIG. 7 schematically illustrate plan views of some layers of FIG. 2, which schematically illustrates a plan view of a display device according to an embodiment. Particularly, FIG. 4 to FIG. 6 schematically illustrate sequential plan views of a manufacturing order of a display device according to an embodiment. FIG. 2 to FIG. 7 schematically illustrate three adjacent pixels of a display device according to an embodiment, and these pixels may be continuously and repeatedly disposed.

A display device according to an embodiment may include a substrate 110. The substrate 110 may include a material that has a rigid characteristic such as glass and thus may not be bent, or may include a flexible material such as plastic or polyimide that may be bent. The substrate 110 may include pixels PX1, PX2, and PX3. Here, each of the pixels PX1, PX2, and PX3 may mean the constituent element included in a pixel described above, for example, a portion or region in which the driving transistors Td1, Td2, and Td3, the switching transistors Ts1, Ts2, and Ts3, the capacitors Cst1, Cst2, and Cst3, and the light emitting diodes ED1, ED2, and ED3 may be formed.

A buffer layer 111 may be disposed on the substrate 110. The buffer layer 111 may be disposed between the substrate 110 and a semiconductor layer to block impurities from the substrate 110 during a crystallization process to form polycrystalline silicon, thereby improving characteristics of the polycrystalline silicon. In addition, a stress of the semiconductor layer formed on the buffer layer 111 may be reduced by flattening the substrate 110. The buffer layer 111 may include an inorganic insulating material such as a silicon nitride (SiNx), a silicon oxide (SiOx), a silicon oxynitride (SiOxNy), or a combination thereof. The buffer layer may be a single-layered or multi-layered structure of the material. In some embodiments, the buffer layer 111 may be omitted.

A barrier layer (not shown) may be further disposed between the substrate 110 and the buffer layer 111. The barrier layer may include an inorganic material, and for example, may include an inorganic insulating material such as a silicon nitride (SiNx), a silicon oxide (SiOx), a silicon oxynitride (SiOxNy), or a combination thereof. The barrier layer may be a single-layered or multi-layered structure of the material.

A semiconductor layer including a semiconductor layer 1130 of each of the driving transistors Td1, Td2, and Td3 of respective pixels PX1, PX2, and PX3 and a semiconductor layer 2130 of each of the switching transistors Ts1, Ts2, and Ts3 thereof may be disposed on the buffer layer 111. FIG. 4 illustrates a semiconductor layer, which may be a partial layer of a display device according to an embodiment. The semiconductor layer may include at least one semiconductor material such as amorphous silicon, polycrystalline silicon, or an oxide semiconductor.

The semiconductor layer 1130 of each of the driving transistors Td1, Td2, and Td3 of respective pixels PX1, PX2, and PX3 may include a first region 1131, a channel 1132, and a second region 1133. In this case, the first region 1131 and the second region 1133 may be a source region or a drain region. The first region 1131, the channel 1132, and the second region 1133 may be integrally formed, and may have a bar shape. The channel 1132 of the semiconductor layer 1130 of each of the driving transistors Td1, Td2, and Td3 may be disposed between the first region 1131 and the second region 1133. The driving transistors Td1, Td2, and Td3 of respective pixels PX1, PX2, and PX3 may be sequentially disposed along a direction. For example, in a plan view, the driving transistor Td2 of the second pixel PX2 may be disposed below the driving transistor Td1 of the first pixel PX1, and the driving transistor Td3 of the third pixel PX3 may be disposed below the driving transistor Td2 of the second pixel PX2. For example, the driving transistor Td1 of the first pixel PX1, the driving transistor Td2 of the second pixel PX2, and the driving transistor Td3 of the third pixel PX3 may be sequentially disposed along a column direction.

The semiconductor layer 2130 of each of the switching transistors Ts1, Ts2, and Ts3 of respective pixels PX1, PX2, and PX3 may include a first region 2131, a channel 2132, and a second region 2133. In this case, the first region 2131 and the second region 2133 may be a source region or a drain region. The first region 2131, the channel 2132, and the second region 2133 may be integrally formed, and may have a bar shape. The channels 2132 of the semiconductor layers 2130 of the switching transistors Ts1, Ts2, and Ts3 may be disposed between the first region 2131 and the second region 2133. The switching transistors Ts1, Ts2, and Ts3 of respective pixels PX1, PX2, and PX3 may be sequentially disposed along a direction. For example, in a plan view, the switching transistor Ts2 of the second pixel PX2 may be disposed below the switching transistor Ts1 of the first pixel PX1, and the switching transistor Ts3 of the third pixel PX3 may be disposed below the switching transistor Ts2 of the second pixel PX2. For example, the switching transistor Ts1 of the first pixel PX1, the switching transistor Ts2 of the second pixel PX2, and the switching transistor Ts3 of the third pixel PX3 may be sequentially disposed along a column direction.

A first insulation layer 120 may be disposed on the semiconductor layer including the semiconductor layer 1130 of each of the driving transistors Td1, Td2, and Td3 and the semiconductor layer 2130 of each of the switching transistors Ts1, Ts2, and Ts3.

A first conductive layer including a gate electrode 1155 of each of the driving transistors Td1, Td2, and Td3 of respective pixels PX1, PX2, and PX3, gate electrodes 2155 of each of the switching transistors Ts1, Ts2, and Ts3 thereof, and a lower storage electrode 1153 may be disposed on the first insulation layer 120. FIG. 5 illustrates the semiconductor layer and the first conductive layer, which may be some layers of a display device according to an embodiment.

The gate electrode 1155 of each of the driving transistors Td1, Td2, and Td3 of respective pixels PX1, PX2, and PX3 may overlap the channel 1132 of each of the driving transistors Td1, Td2, and Td3. The gate electrode 1155 of each of the driving transistors Td1, Td2, and Td3 may be connected to the lower storage electrode 1153. In this case, the gate electrode 1155 of each of the driving transistors Td1, Td2, and Td3 may be integrally formed with the lower storage electrode 1153. The lower storage electrode 1153 may extend from the gate electrode 1155 of each of the driving transistors Td1, Td2, and Td3.

The lower storage electrode 1153 may overlap the second region 2133 of the semiconductor layer 2130 of each of the switching transistors Ts1, Ts2, and Ts3. The lower storage electrode 1153 may be connected to the second region 2133 of the semiconductor layer 2130 of each of the switching transistors Ts1, Ts2, and Ts3. The lower storage electrode 1153 may be directly connected to the second region 2133 of the semiconductor layer 2130 of each of the switching transistors Ts1, Ts2, and Ts3, or may be indirectly connected thereto through another connection electrode. The lower storage electrodes 1153 of the first to third pixels PX1, PX2, and PX3 may be disposed to be adjacent to each other along a direction. In a plan view, the lower storage electrode 1153 of the second pixel PX2 may be disposed below the lower storage electrode 1153 of the first pixel PX1, and the lower storage electrode 1153 of the third pixel PX3 may be disposed below the lower storage electrode 1153 of the second pixel PX2.

The gate electrode 2155 of each of the switching transistors Ts1, Ts2, and Ts3 may overlap the channel 2132 of each of the switching transistors Ts1, Ts2, and Ts3. The gate electrode 2155 of each of the switching transistors Ts1, Ts2, and Ts3 of respective pixels PX1, PX2, and PX3 may be connected to each other, and may be integrally formed. Accordingly, a same scan signal SC may be applied to the gate electrode 2155 of each of the switching transistors Ts1, Ts2, and Ts3 of the first to third pixels PX1, PX2, and PX3. In this case, the gate electrode 2155 of each of the switching transistors Ts1, Ts2, and Ts3 connected to each other may be formed to have a rod shape extending along a direction. For example, the gate electrode 2155 of each of the switching transistors Ts1, Ts2, and Ts3 of the first to third pixels PX1, PX2, and PX3 may be extended in a column direction.

The first conductive layer may further include a scan line 151. The scan line 151 may extend along a direction, for example, may extend in a row direction. The scan line 151 may be connected to the gate electrode 2155 of each of the switching transistors Ts1, Ts2, and Ts3 of the first to third pixels PX1, PX2, and PX3. The first scan line 151 may be integrally formed with the gate electrode 2155 of each of the switching transistors Ts1, Ts2, and Ts3 of the first to third pixels PX1, PX2, and PX3.

After the first conductive layer may be formed, a doping process may be performed. The semiconductor layer covered by the first conductive layer may not be doped, and a portion of the semiconductor layer that may not be covered by the first conductive layer may be doped to have a same characteristic as a conductor. For example, the channel 1132 of each of the driving transistors Td1, Td2, and Td3 and the channel 2132 of each of the switching transistors Ts1, Ts2, and Ts3 that may be covered by the first conductive layer may not be doped. The first region 1131 and the second region 1133 of each of the driving transistors Td1, Td2, and Td3 and the first region 2131 and the second region 2133 of each of the switching transistors Ts1, Ts2, and Ts3 that may not be covered by the first conductive layer may be doped to have a same characteristic as a conductor.

A second insulation layer 160 may be disposed on the first conductive layer including the gate electrode 1155 of each of the driving transistors Td1, Td2, and Td3, the gate electrode 2155 of each of the switching transistors Ts1, Ts2, and Ts3, and the lower storage electrode 1153.

A second conductive layer including data lines 171a, 171b, and 171c, a driving voltage line 172, and an upper storage electrode 1154 may be disposed on the second insulation layer 160. FIG. 6 illustrates the semiconductor layer, the first conductive layer, and the second conductive layer, which may be some layers of a display device according to an embodiment.

The data lines 171a, 171b, and 171c may include a first data line 171a, a second data line 171b, and a third data line 171c. The first data line 171a, the second data line 171b, and the third data line 171c may be extended long along a direction. For example, the first data line 171a, the second data line 171b, and the third data line 171c may be extended long along a column direction. The first data line 171a, the second data line 171b, and the third data line 171c may be disposed to be adjacent to each other, and may be disposed to be spaced apart from each other at intervals. The first data line 171a, the second data line 171b, and the third data line 171c may be applied with different data voltages DL1, DL2, and DL3, and may be spaced apart from each other so that a short circuit may not occur. The second data line 171b may be disposed to be adjacent to the left side of the first data line 171a, and the third data line 171c may be disposed to be adjacent to the left side of the second data line 171b.

The first region 2131 of the semiconductor layer 2130 of each of the switching transistors Ts1, Ts2, and Ts3 may overlap the data lines 171a, 171b, and 171c, and may be connected to the data lines 171a, 171b, and 171c. The switching transistor Ts1 of the first pixel PX1 may be connected to the first data line 171a. The second insulation layer 160 may include a contact hole 165 overlapping the first region 2131 and the first data line 171a of the semiconductor layer 2130 of the switching transistor Ts1. The contact hole 165 may be further formed in the first insulation layer 120. The first data line 171a may be connected to the first region 2131 of the semiconductor layer 2130 of the switching transistor Ts1 through the contact hole 165. However, embodiments are not limited thereto, and the first data line 171a may be connected to the first region 2131 of the semiconductor layer 2130 of the switching transistor Ts1 through another connection electrode. Similarly, the switching transistor Ts2 of the second pixel PX2 may be connected to the second data line 171b, and the switching transistor Ts3 of the third pixel PX3 may be connected to the third data line 171c. Lengths of the semiconductor layers 2130 of the switching transistors Ts1, Ts2, and Ts3 of respective pixels PX1, PX2, and PX3 may be different. For example, the length of the semiconductor layer 2130 of the switching transistor Ts1 of the first pixel PX1 may be longer than that of the semiconductor layer 2130 of the switching transistor Ts2 of the second pixel PX2. The length of the semiconductor layer 2130 of the switching transistor Ts2 of the second pixel PX2 may be longer than that of the semiconductor layer 2130 of the switching transistor Ts3 of the third pixel PX3.

The driving voltage line 172 may be extended long along a direction. The driving voltage line 172 may extend in a direction parallel to the data lines 171a, 171b, and 171c. For example, the driving voltage line 172 may be extended long along a column direction. The driving voltage ELVDD may be applied to the driving voltage line 172.

The first region 1131 of the semiconductor layer 1130 of each of the driving transistors Td1, Td2, and Td3 may overlap the driving voltage line 172. The first region 1131 of the semiconductor layer 1130 of each of the driving transistors Td1, Td2, and Td3 may be connected to the driving voltage line 172, and may receive the driving voltage ELVDD from the driving voltage line 172. The second insulation layer 160 may include a contact hole 161 overlapping the driving voltage line 172 and the first region 1131 of the semiconductor layer 1130 of each of the driving transistors Td1, Td2, and Td3. The contact hole 161 may be further formed in the first insulation layer 120. The driving voltage line 172 may be connected to the first region 1131 of the semiconductor layer 1130 of each of the driving transistors Td1, Td2, and Td3 through the contact hole 161. However, embodiments are not limited thereto, and the driving voltage line 172 may be connected to the first region 1131 of the semiconductor layer 1130 of each of the driving transistors Td1, Td2, and Td3 through another connection electrode.

The upper storage electrode 1154 may overlap the lower storage electrode 1153. The lower storage electrode 1153 and the upper storage electrode 1154 may overlap each other with the second insulation layer 160 therebetween to form each capacitor Cst1, Cst2, or Cst3. The upper storage electrode 1154 may overlap the second region 1133 of the semiconductor layer 1130 of each of the driving transistors Td1, Td2, and Td3. The second insulation layer 160 may include a contact hole 162 overlapping the upper storage electrode 1154 and the second region 1133 of the semiconductor layer 1130 of each of the driving transistors Td1, Td2, and Td3. The contact hole 162 may be further formed in the first insulation layer 120. The upper storage electrode 1154 may be connected to the second region 1133 of the semiconductor layer 1130 of each of the driving transistors Td1, Td2, and Td3 through the contact hole 162. The upper storage electrodes 1154 of the first to third pixels PX1, PX2, and PX3 may be disposed to be adjacent to each other along a direction. In a plan view, the upper storage electrode 1154 of the second pixel PX2 may be disposed below the upper storage electrode 1154 of the first pixel PX1, and the upper storage electrode 1154 of the third pixel PX3 may be disposed below the upper storage electrode 1154 of the second pixel PX2.

The second conductive layer may further include a connection electrode 179. Each of the pixels PX1, PX2, and PX3 may include the connection electrode 179. The connection electrode 179 of each of the pixels PX1, PX2, and PX3 may overlap the lower storage electrode 1153. The second insulation layer 160 may include a contact hole 163 overlapping the connection electrode 179 and the lower storage electrode 1153. The connection electrode 179 may be connected to the lower storage electrode 1153 through the contact hole 163. The connection electrode 179 of each of the pixels PX1, PX2, and PX3 may overlap the second region 2133 of the semiconductor layer 2130 of each of the switching transistors Ts1, Ts2, and Ts3. The second insulation layer 160 may include a contact hole 164 overlapping the connection electrode 179 and the second region 2133 of the semiconductor layer 2130 of each of the switching transistors Ts1, Ts2, and Ts3. The contact hole 164 may be further formed in the first insulation layer 120. The connection electrode 179 may be connected to the second region 2133 of the semiconductor layer 2130 of each of the switching transistors Ts1, Ts2, and Ts3 through the contact hole 164. Accordingly, the connection electrode 179 may connect the lower storage electrode 1153 and the second region 2133 of the semiconductor layer 2130 of each of the switching transistors Ts1, Ts2, and Ts3 in each of the pixels PX1, PX2, and PX3.

A passivation film 180 may be disposed on the second conductive layer including the data lines 171a, 171b, and 171c, the driving voltage line 172, and the upper storage electrode 1154.

Figure 7:
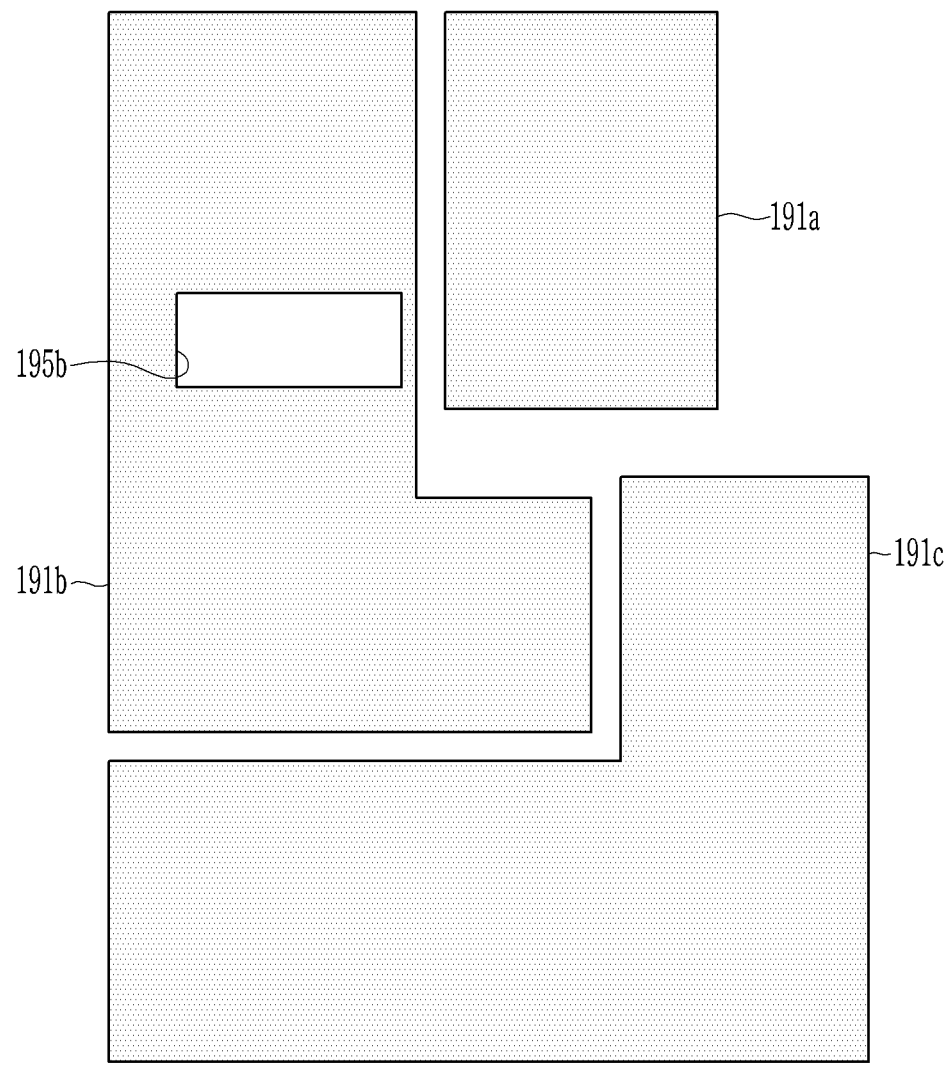

A third conductive layer including a first pixel electrode 191a, a second pixel electrode 191b, and a third pixel electrode 191c may be disposed on the passivation film 180. FIG. 7 illustrates the third semiconductor layer, which may be a partial layer of a display device according to an embodiment.

The pixel electrodes 191a, 191b, and 191c may also be referred to as an anode electrode, and may be formed as a single layer or multilayer that may include a transparent conductive oxide film or a metallic material. The transparent conductive oxide film may include at least one of an indium tin oxide (ITO), a poly-ITO, an indium zinc oxide (IZO), an indium gallium zinc oxide (IGZO), and an indium tin zinc oxide (ITZO). The metallic material may include silver (Ag), molybdenum (Mo), copper (Cu), gold (Au), aluminum (Al), or a combination thereof.

The first pixel electrode 191a may be connected to the driver PXD1 of the first pixel PX1. Particularly, the first pixel electrode 191a may be connected to the driving transistor Td1 of the first pixel PX1. The passivation film 180 may include a contact hole 181 overlapping the first pixel electrode 191a and the upper storage electrode 1154. The first pixel electrode 191a may be connected to the upper storage electrode 1154 through the contact hole 181. The upper storage electrode 1154 may be connected to the second region 1133 of the semiconductor layer 1130 of the driving transistor Td1 of the first pixel PX1. Accordingly, the first pixel electrode 191a may be connected to the second region 1133 of the semiconductor layer 1130 of the driving transistor Td1 of the first pixel PX1.

Similarly, the second pixel electrode 191b may be connected to the driving transistor Td2 of the driver PXD2 of the second pixel PX2, and the third pixel electrode 191c may be connected to the driving transistor Td3 of the driver PXD2 of the third pixel PX3.

The first pixel electrode 191a may overlap the driver PXD1 of the first pixel PX1. The first pixel electrode 191a may not overlap the driver PXD2 of the second pixel PX2 and the driver PXD3 of the third pixel PX3. Since the first pixel electrode 191a may not overlap a driver of another pixel, parasitic capacitance may not be formed between the first pixel electrode 191a and another pixel.

The second pixel electrode 191b may overlap the driver PXD1 of the first pixel PX1 and the driver PXD2 of the second pixel PX2. The second pixel electrode 191b may not overlap the driver PXD3 of the third pixel PX3. Since the second pixel electrode 191b may overlap a driver of another pixel, parasitic capacitance may be formed between the second pixel electrode 191b and the driver of another pixel. For example, parasitic capacitance may be formed by overlapping the second pixel electrode 191b and the driving transistor Td1 of the first pixel PX1, and thus luminance of the second pixel PX2 may be lowered. However, the second pixel electrode 191b may overlap the lower storage electrode 1153 and the upper storage electrode 1154 of the first pixel PX1, and the resulting parasitic capacitance may hardly affect the luminance of the second pixel PX2. Further, in a display device according to an embodiment, since the second pixel electrode 191b overlapping the driver of another pixel may include an opening 195b, parasitic capacitance formed between the second pixel electrode 191b and another pixel may be reduced.

The second pixel electrode 191b may include the opening 195b overlapping the driving transistor Td1 of the first pixel PX1. For example, an overlapping area of the second pixel electrode 191b and the driving transistor Td1 of the first pixel PX1 may be reduced by the opening 195b formed in the second pixel electrode 191b. The opening 195b may overlap the gate electrode 1155 of the driving transistor Td1 of the first pixel PX1. The opening 195b may overlap the first region 1131, the channel 1132, and the second region 1133 of the semiconductor layer 1130 of the driving transistor Td1 of the first pixel PX1. The opening 195b may overlap the first region 1131 of the semiconductor layer 1130 of the driving transistor Td1 of the first pixel PX1 and a connection portion of the driving voltage line 172, for example, the contact hole 161. The opening 195b may overlap the second region 1133 of the semiconductor layer 1130 of the driving transistor Td1 of the first pixel PX1 and a connection portion of the upper storage electrode 1154, for example, the contact hole 162. As the overlapping area of the opening 195b and the first pixel PX1 may be wider, parasitic capacitance may be further reduced. However, as an area of the opening 195b increases, transmittance of the second pixel PX2 may be disadvantageous. In a display device according to an embodiment, by allowing the opening 195b to overlap the driving transistor Td1 of the first pixel PX1, parasitic capacitance may be effectively reduced without forming a large area of the opening 195b. For example, while minimizing an amount of decrease in transmittance of the second pixel PX2, luminance deterioration due to parasitic capacitance may be effectively prevented.

The third pixel electrode 191c may overlap the driver PXD2 of the second pixel PX2 and the driver PXD3 of the third pixel PX3. The third pixel electrode 191c may not overlap the driver PXD1 of the first pixel PX1. The third pixel electrode 191c may overlap a driver of another pixel, but may not overlap a driving transistor of another pixel. The third pixel electrode 191c may overlap the switching transistor Ts2 of the second pixel PX2, but may not overlap the driving transistor Td2. Therefore, parasitic capacitance formed between the third pixel electrode 191c and another pixel may hardly influence luminance of the third pixel PX3.

A pixel defining layer 350 (PDL) may be disposed on the third conductive layer including the first pixel electrode 191a, the second pixel electrode 191b, and the third pixel electrode 191c, and the passivation film 180. The pixel defining layer 350 may include a pixel opening 351. The pixel opening 351 may overlap the first pixel electrode 191a, the second pixel electrode 191b, and the third pixel electrode 191c. The pixel opening 351 may overlap central portions of the first pixel electrode 191a, the second pixel electrode 191b, and the third pixel electrode 191c. The pixel defining layer 350 may be formed to cover edges of the first pixel electrode 191a, the second pixel electrode 191b, and the third pixel electrode 191c. The pixel defining layer 350 may be disposed within the opening 195b to cover the opening 195b. In this case, the pixel defining layer 350 may be formed to cover a portion of the second pixel electrode 191b disposed around the opening 195b.

An emission layer 370 may be disposed on the first pixel electrode 191a, the second pixel electrode 191b, the third pixel electrode 191c, and the pixel defining layer 350. The emission layer 370 may be entirely disposed on the substrate 110. The emission layer 370 may include an organic material that emits light. For example, the emission layer 370 may include a low molecular or high molecular organic material emitting blue light. However, embodiments are not limited thereto, and the emission layer 370 may not be entirely disposed on the substrate 110, and may be disposed only in a partial area. In this case, the emission layer 370 may be disposed within the pixel opening 351 of each of the pixels PX1, PX2, and PX3. In this case, the emission layer 370 disposed within the pixel opening 351 of each of the pixels PX1, PX2, and PX3 may be made of organic materials emitting light of different wavelengths.

The emission layer 370 is shown as a single layer, but auxiliary layers such as an electron injection layer, an electron transporting layer, a hole transporting layer, and a hole injection layer may be included above and below the emission layer 370. In this case, the hole injection layer and the hole transporting layer may be disposed below the emission layer 370, and the electron transporting layer and the electron injection layer may be disposed above the emission layer 370.

A common electrode 270 may be disposed on the emission layer 370. The common electrode 270 may be also referred to as a cathode, and may be formed of a transparent conductive layer including at least one of an indium tin oxide (ITO), an indium zinc oxide (IZO), an indium gallium zinc oxide (IGZO), and an indium tin zinc oxide (ITZO). The common electrode 270 may be disposed on the entire substrate 110.

The pixel electrodes 191a, 191b, and 191c, the emission layers 370, and the common electrodes 270 may form the light emitting diodes ED1, ED2, and ED3 of the pixels PX1, PX2, and PX3, respectively. The pixel electrodes 191a, 191b, and 191c may contain a highly reflective metallic material, and light emitted from the emission layer 370 may be reflected by the pixel electrodes 191a, 191b, and 191c to pass through the common electrode 270 to be emitted to the outside.

Although not shown, an encapsulation layer including an organic insulating material and/or an inorganic insulating material may be disposed on the common electrode 270. A filling layer including a filler may be disposed on the encapsulation layer, and a cover layer including an insulating material, and color conversion layers and transmissive layers, may be disposed on the filling layer.

The color conversion layer may convert a wavelength of incident light to emit light having a different wavelength, and the transmissive layer may emit incident light as it is. The pixels PX1, PX2, and PX3 may include different color conversion layers or transmissive layers to emit light of different colors. For example, the first pixel PX1 may display blue light as it is, including a transmissive layer. The second pixel PX2 may include a green conversion layer to emit green light. The third pixel PX3 may include a red conversion layer to emit red light. The color conversion layer may include different semiconductor nanocrystals. The semiconductor nanocrystal may include at least one of phosphor and quantum dot materials that convert a wavelength of incident light. The quantum dot may control a color of emitted light according to a particle size thereof, and thus the quantum dot may have various light emitting colors such as blue, red, and green colors.

An insulation layer may be disposed on the color conversion layers and transmissive layers, and color filters and light blocking members may be disposed thereon.

Hereinafter, a display device according to an embodiment will be described with reference to FIG. 8.

Figure 8:
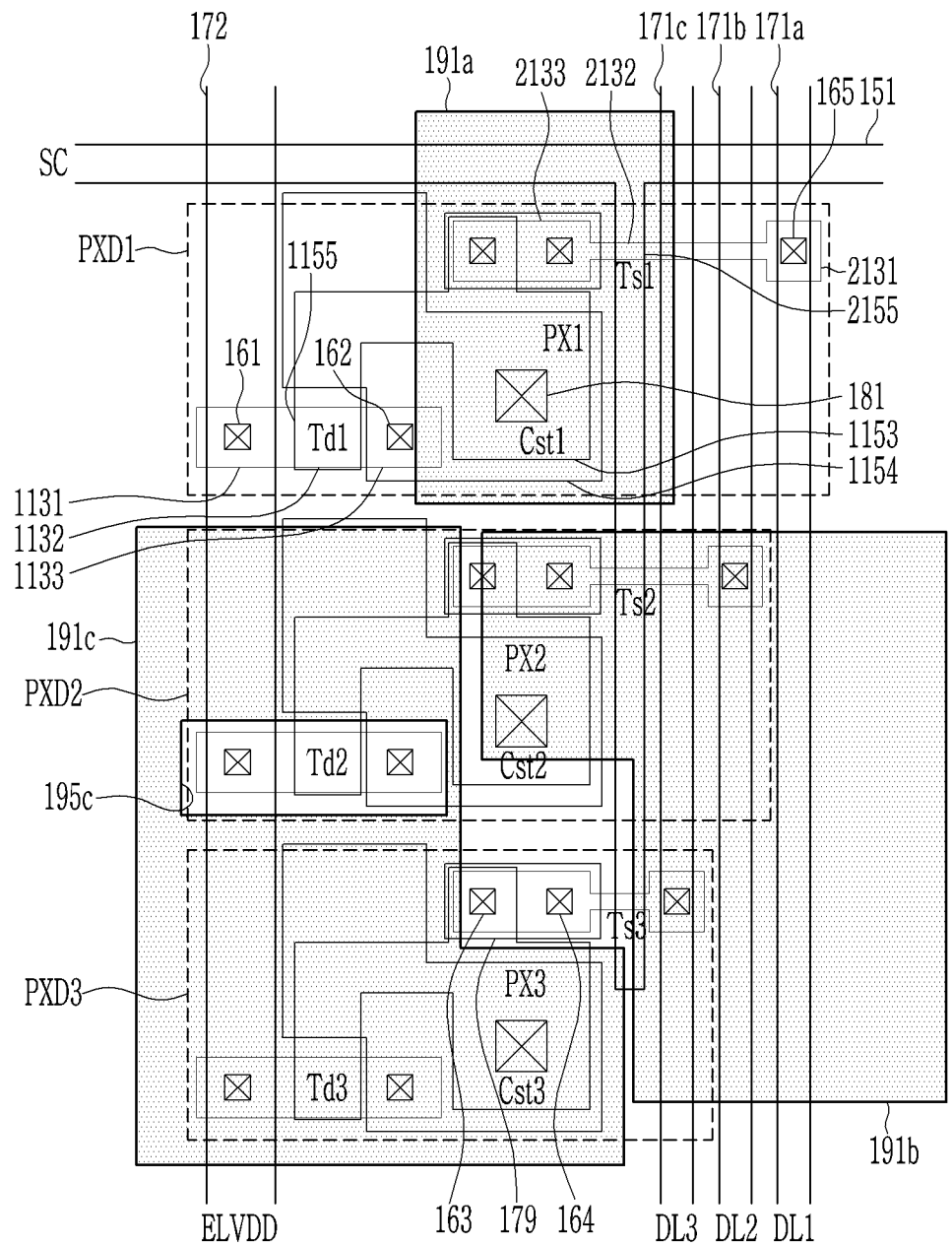
FIG. 8 schematically illustrates a plan view of a display device according to an embodiment.

Since many portions of a display device according to an embodiment shown in FIG. 8 may be the same as those of a display device according to an embodiment shown in FIG. 1 to FIG. 7, a repeated description thereof will be omitted. Embodiments may differ from other embodiments in that the third pixel electrode may include an opening, and will be further described below.

FIG. 8 schematically illustrates a plan view of a display device according to an embodiment.

A display device according to an embodiment may include the substrate 110, the driving transistors Td1, Td2, and Td3 and the switching transistors Ts1, Ts2, and Ts3 of the pixels PX1, PX2, and PX3 disposed on the substrate 110, the pixel electrodes 191a, 191b, and 191c connected to the driving transistors Td1, Td2, and Td3, the emission layer 370 disposed on each of the pixel electrodes 191a, 191b, and 191c, and the common electrode 270 disposed on the emission layer 370.

The first pixel electrode 191a may overlap the driver PXD1 of the first pixel PX1. The first pixel electrode 191a may not overlap the driver PXD2 of the second pixel PX2 and the driver PXD3 of the third pixel PX3.

The second pixel electrode 191b may overlap the driver PXD2 of the second pixel PX2 and the driver PXD3 of the third pixel PX3. The second pixel electrode 191b may not overlap the driver PXD1 of the first pixel PX1. The second pixel electrode 191b may overlap the switching transistor Ts3 of the third pixel PX3, and may not overlap the driving transistor Td3.

The third pixel electrode 191c may overlap the driver PXD2 of the second pixel PX2 and the driver PXD3 of the third pixel PX3. The third pixel electrode 191c may not overlap the driver PXD1 of the first pixel PX1. The third pixel electrode 191c may include an opening 195c. The opening 195c may overlap the driving transistor Td2 of the second pixel PX2. An overlapping area of the third pixel electrode 191c and the driving transistor Td2 of the second pixel PX2 may be reduced by the opening 195c formed in the third pixel electrode 191c. The opening 195c may overlap the gate electrode 1155 of the driving transistor Td2 of the second pixel PX2. The opening 195c may overlap the first region 1131, the channel 1132, and the second region 1133 of the semiconductor layer 1130 of the driving transistor Td2 of the second pixel PX2. The opening 195c may overlap the first region 1131 of the semiconductor layer 1130 of the driving transistor Td2 of the second pixel PX2 and a connection portion of the driving voltage line 172, for example, the contact hole 161. The opening 195c may overlap the second region 1133 of the semiconductor layer 1130 of the driving transistor Td2 of the second pixel PX2 and a connection portion of the upper storage electrode 1154, for example, the contact hole 162.

In a display device according to an embodiment, since the third pixel electrode 191c overlapping another pixel may include the opening 195c, parasitic capacitance formed between the third pixel electrode 191c and another pixel may be reduced.

Hereinafter, a display device according to an embodiment will be described with reference to FIG. 9.

Figure 9:
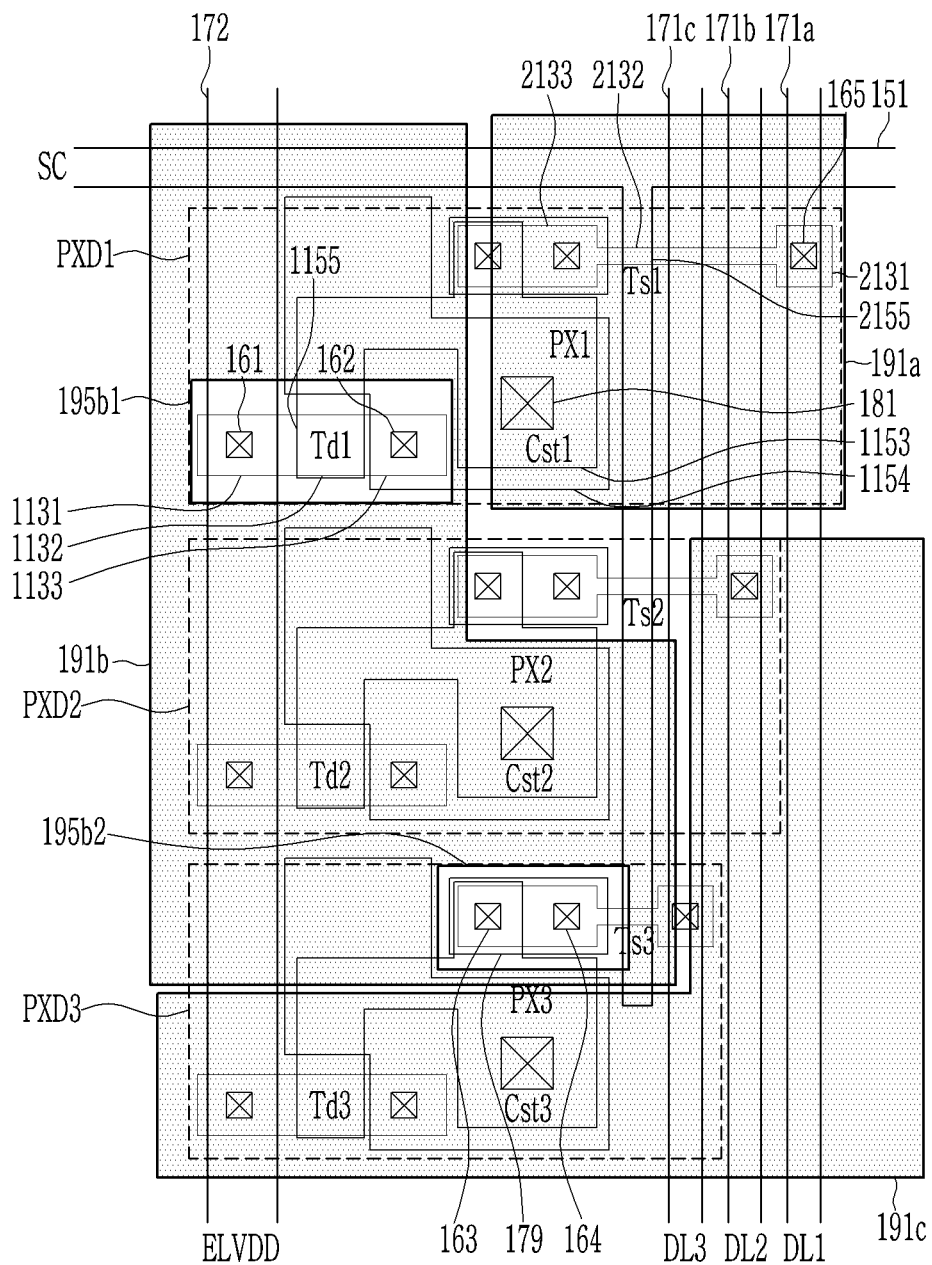
FIG. 9 schematically illustrates a plan view of a display device according to an embodiment.

Since many portions of a display device according to an embodiment shown in FIG. 9 may be the same as those of a display device according to an embodiment shown in FIG. 1 to FIG. 7, a repeated description thereof will be omitted. An embodiment may differ from another embodiment in that the second pixel electrode may include two openings, and will be further described below.

FIG. 9 schematically illustrates a plan view of a display device according to an embodiment.

A display device according to an embodiment may include the substrate 110, the driving transistors Td1, Td2, and Td3 and the switching transistors Ts1, Ts2, and Ts3 of the pixels PX1, PX2, and PX3 disposed on the substrate 110, the pixel electrodes 191a, 191b, and 191c connected to the driving transistors Td1, Td2, and Td3, the emission layer 370 disposed on each of the pixel electrodes 191a, 191b, and 191c, and the common electrode 270 disposed on the emission layer 370.

The first pixel electrode 191a may overlap the driver PXD1 of the first pixel PX1. The first pixel electrode 191a may not overlap the driver PXD2 of the second pixel PX2 and the driver PXD3 of the third pixel PX3.

The second pixel electrode 191b may overlap the driver PXD1 of the first pixel PX1, the driver PXD2 of the second pixel PX2, and the driver PXD3 of the third pixel PX3. The second pixel electrode 191b may include a first opening 195b1 and a second opening 195b2. The first opening 195b1 may overlap the driving transistor Td1 of the first pixel PX1. An overlapping area of the second pixel electrode 191b and the driving transistor Td1 of the first pixel PX1 may be reduced by the first opening 195b1 formed in the second pixel electrode 191b. The first opening 195b1 may overlap the gate electrode 1155 of the driving transistor Td1 of the first pixel PX1. The first opening 195b1 may overlap the first region 1131, the channel 1132, and the second region 1133 of the semiconductor layer 1130 of the driving transistor Td1 of the first pixel PX1. The first opening 195b1 may overlap the first region 1131 of the semiconductor layer 1130 of the driving transistor Td1 of the first pixel PX1 and a connection portion of the driving voltage line 172, for example, the contact hole 161. The first opening 195b1 may overlap the second region 1133 of the semiconductor layer 1130 of the driving transistor Td1 of the first pixel PX1 and a connection portion of the upper storage electrode 1154, for example, the contact hole 162. The second opening 195b2 may overlap the switching transistor Ts3 of the third pixel PX3. An overlapping area of the second pixel electrode 191b and the switching transistor Ts3 of the third pixel PX3 may be reduced by the second opening 195b2 formed in the second pixel electrode 191b. The second opening 195b2 may overlap the gate electrode 2155 of the switching transistor Ts3 of the third pixel PX3. The second opening 195b2 may overlap at least a portion of the semiconductor layer 2130 of the switching transistor Ts3 of the third pixel PX3. For example, the second opening 195b2 may overlap the channel 2132 and the second region 2133 of the semiconductor layer 2130 of the switching transistor Ts3 of the third pixel PX3. The second opening 195b2 may overlap the second region 2133 of the semiconductor layer 2130 of the switching transistor Ts3 of the third pixel PX3 and a connection portion of the connection electrode 179, for example, the contact hole 164. The second opening 195b2 may overlap the connection electrode 179 of the third pixel PX3 and a connection portion of the lower storage electrode 1153, for example, the contact hole 163.

The third pixel electrode 191c may overlap the driver PXD2 of the second pixel PX2 and the driver PXD3 of the third pixel PX3. The third pixel electrode 191c may not overlap the driver PXD1 of the first pixel PX1. The third pixel electrode 191c may overlap the switching transistor Ts2 of the second pixel PX2, and may not overlap the driving transistor Td2.

In a display device according to an embodiment, since the second pixel electrode 191b overlapping another pixel may include the first opening 195b1 and the second opening 195b2, parasitic capacitance formed between the second pixel electrode 191b and another pixel may be reduced.

Hereinafter, a display device according to an embodiment will be described with reference to FIG. 10.

Figure 10:
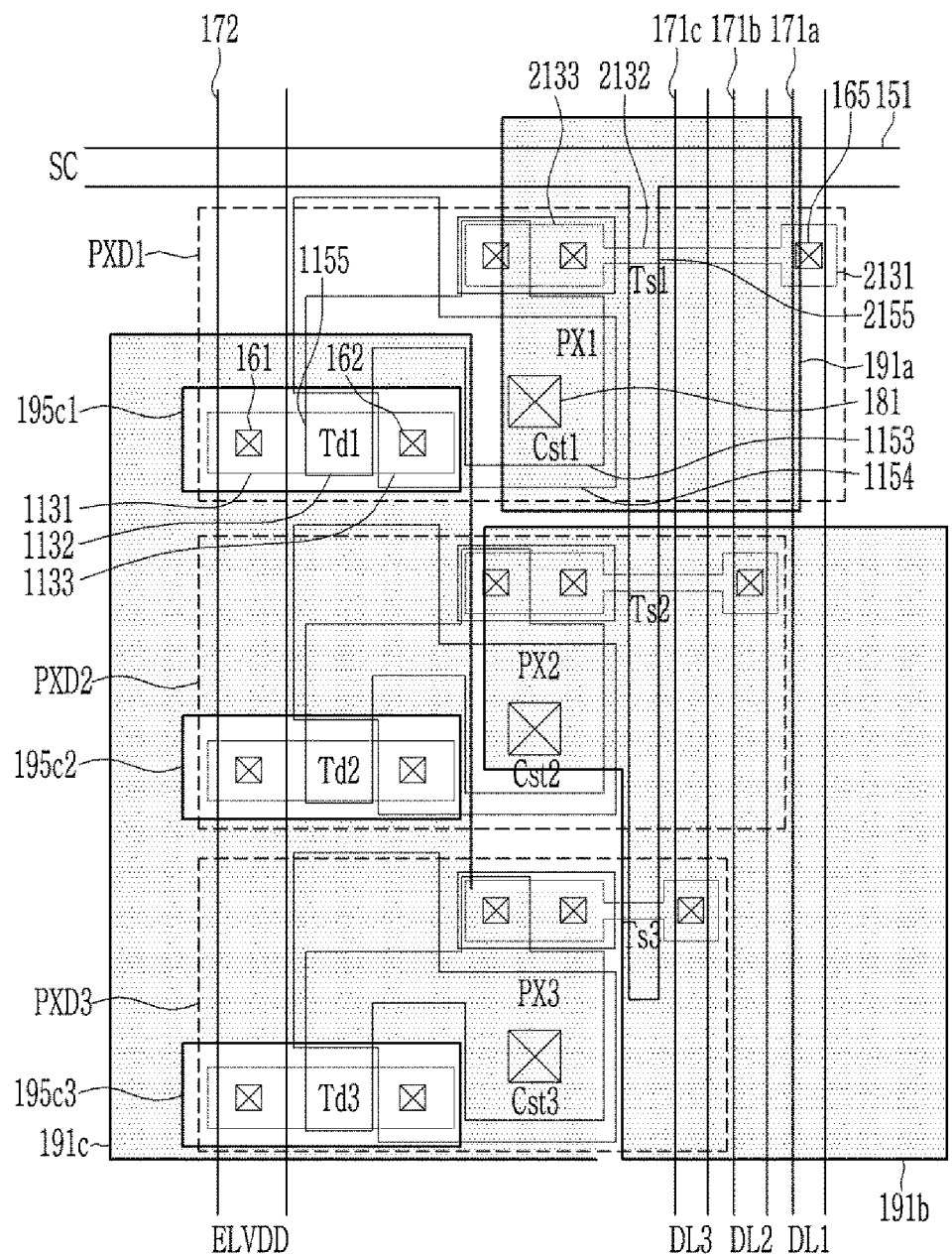
FIG. 10 schematically illustrates a plan view of a display device according to an embodiment.

Since many portions of a display device according to an embodiment shown in FIG. 10 may be the same as those of a display device according to an embodiment shown in FIG. 1 to FIG. 7, a repeated description thereof will be omitted. An embodiment may differ from other embodiments in that the third pixel electrode may include three openings, and will be further described below.

FIG. 10 schematically illustrates a plan view of a display device according to an embodiment.

A display device according to an embodiment may include the substrate 110, the driving transistors Td1, Td2, and Td3 and the switching transistors Ts1, Ts2, and Ts3 of the pixels PX1, PX2, and PX3 disposed on the substrate 110, the pixel electrodes 191a, 191b, and 191c connected to the driving transistors Td1, Td2, and Td3, the emission layer 370 disposed on each of the pixel electrodes 191a, 191b, and 191c, and the common electrode 270 disposed on the emission layer 370.

The first pixel electrode 191a may overlap the driver PXD1 of the first pixel PX1. The first pixel electrode 191a may not overlap the driver PXD2 of the second pixel PX2 and the driver PXD3 of the third pixel PX3.

The second pixel electrode 191b may overlap the driver PXD2 of the second pixel PX2 and the driver PXD3 of the third pixel PX3. The second pixel electrode 191b may not overlap the driver PXD1 of the first pixel PX1. The second pixel electrode 191b may overlap the switching transistor Ts3 of the third pixel PX3, and may not overlap the driving transistor Td3.

The third pixel electrode 191c may overlap the driver PXD1 of the first pixel PX1, the driver PXD2 of the second pixel PX2, and the driver PXD3 of the third pixel PX3. The third pixel electrode 191c may include a first opening 195c1, a second opening 195c2, and a third opening 195c3. The first opening 195c1 may overlap the driving transistor Td1 of the first pixel PX1. An overlapping area of the third pixel electrode 191c and the driving transistor Td1 of the first pixel PX1 may be reduced by the first opening 195c1 formed in the third pixel electrode 191c. The second opening 195c2 may overlap the driving transistor Td2 of the second pixel PX2. An overlapping area of the third pixel electrode 191c and the driving transistor Td2 of the second pixel PX2 may be reduced by the second opening 195c2 formed in the third pixel electrode 191c. The third opening 195c3 may overlap the driving transistor Td3 of the third pixel PX3. An overlapping area of the third pixel electrode 191c and the driving transistor Td3 of the third pixel PX3 may be reduced by the third opening 195c3 formed in the third pixel electrode 191c.

In a display device according to an embodiment, since the third pixel electrode 191c overlapping another pixel may include the first opening 195c1 and the third opening 195c3, parasitic capacitance formed between the third pixel electrode 191c and another pixel may be reduced. In addition, the third pixel electrode 191c may further include the second opening 195c2 overlapping the driving transistor Td3 of the third pixel PX3.

Hereinafter, a display device according to an embodiment will be described with reference to FIG. 11.

Figure 11:
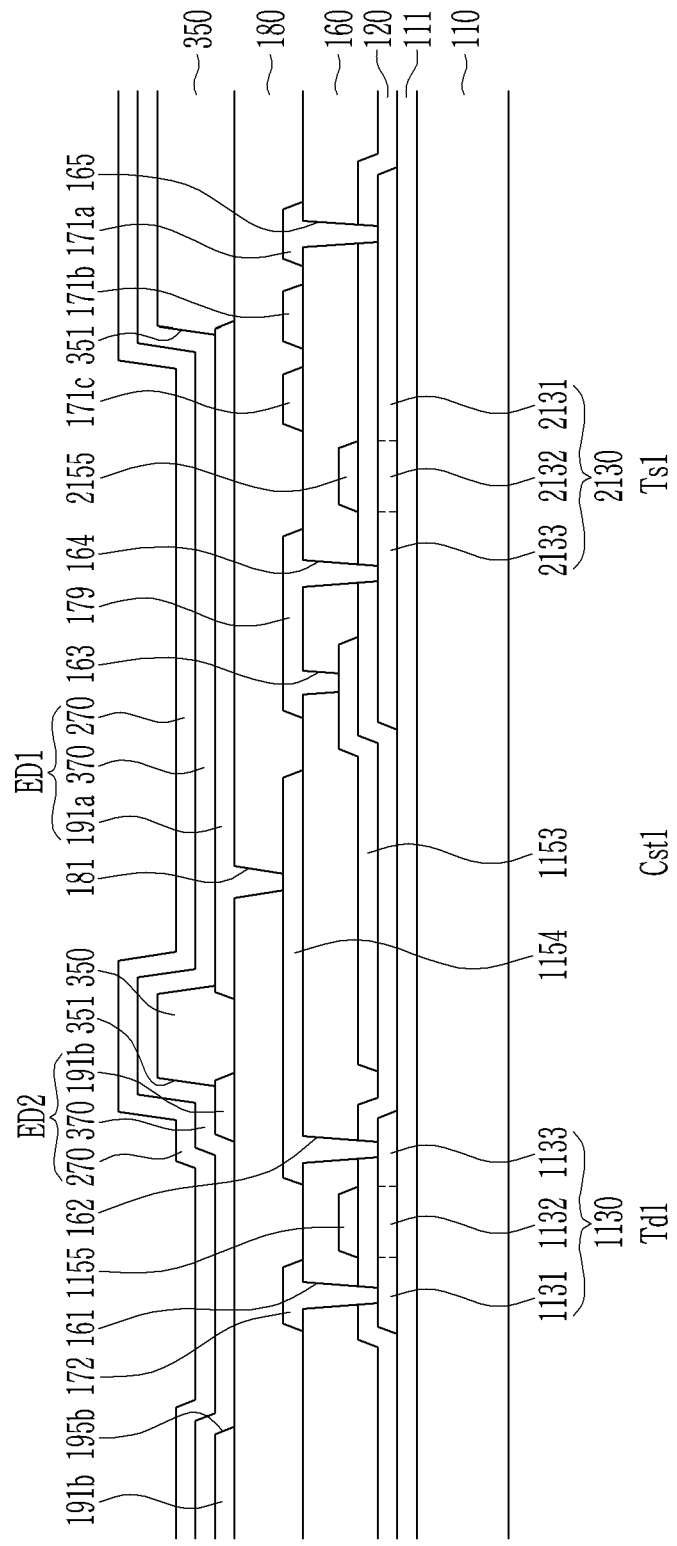
FIG. 11 schematically illustrates a cross-sectional view of a display device according to an embodiment.

Since many portions of a display device according to an embodiment shown in FIG. 11 may be the same as those of a display device according to an embodiment shown in FIG. 1 to FIG. 7, a repeated description thereof will be omitted. An embodiment may differ from other embodiments in that the pixel defining layer may not be disposed within an opening, and will be further described below.

FIG. 11 schematically illustrates a cross-sectional view of a display device according to an embodiment.

A display device according to an embodiment may include the substrate 110, the driving transistors Td1, Td2, and Td3 and the switching transistors Ts1, Ts2, and Ts3 of the pixels PX1, PX2, and PX3 disposed on the substrate 110, the pixel electrodes 191a, 191b, and 191c connected to the driving transistors Td1, Td2, and Td3, the emission layer 370 disposed on each of the pixel electrodes 191a, 191b, and 191c, and the common electrode 270 disposed on the emission layer 370.

The second pixel electrode 191b may overlap the driver PXD1 of the first pixel PX1 and the driver PXD2 of the second pixel PX2. The second pixel electrode 191b may include the opening 195b overlapping the driving transistor Td1 of the first pixel PX1. An overlapping area of the second pixel electrode 191b and the driving transistor Td1 of the first pixel PX1 may be reduced by the opening 195b formed in the second pixel electrode 191b.

The pixel defining layer 350 may be disposed on the pixel electrodes 191a, 191b, and 191c and the passivation film 180, and the pixel defining layer 350 may include the pixel opening 351.

In other embodiments, the pixel defining layer 350 may be disposed within the opening 195b to cover the opening 195b. In an embodiment, the pixel defining layer 350 may not be disposed within the opening 195b to not cover the opening 195b. For example, the pixel opening 351 may overlap the opening 195b of the second pixel electrode 191b. Accordingly, the emission layer 370 may be disposed within the opening 195b of the second pixel electrode 191b. The emission layer 370 may be disposed directly on the passivation film 180 in the opening 195b.

In a display device according to an embodiment, since the second pixel electrode 191b overlapping another pixel may include an opening 195b, parasitic capacitance formed between the second pixel electrode 191b and another pixel may be reduced.

Hereinafter, a display device according to an embodiment will be described with reference to FIG. 12.

Figure 12:
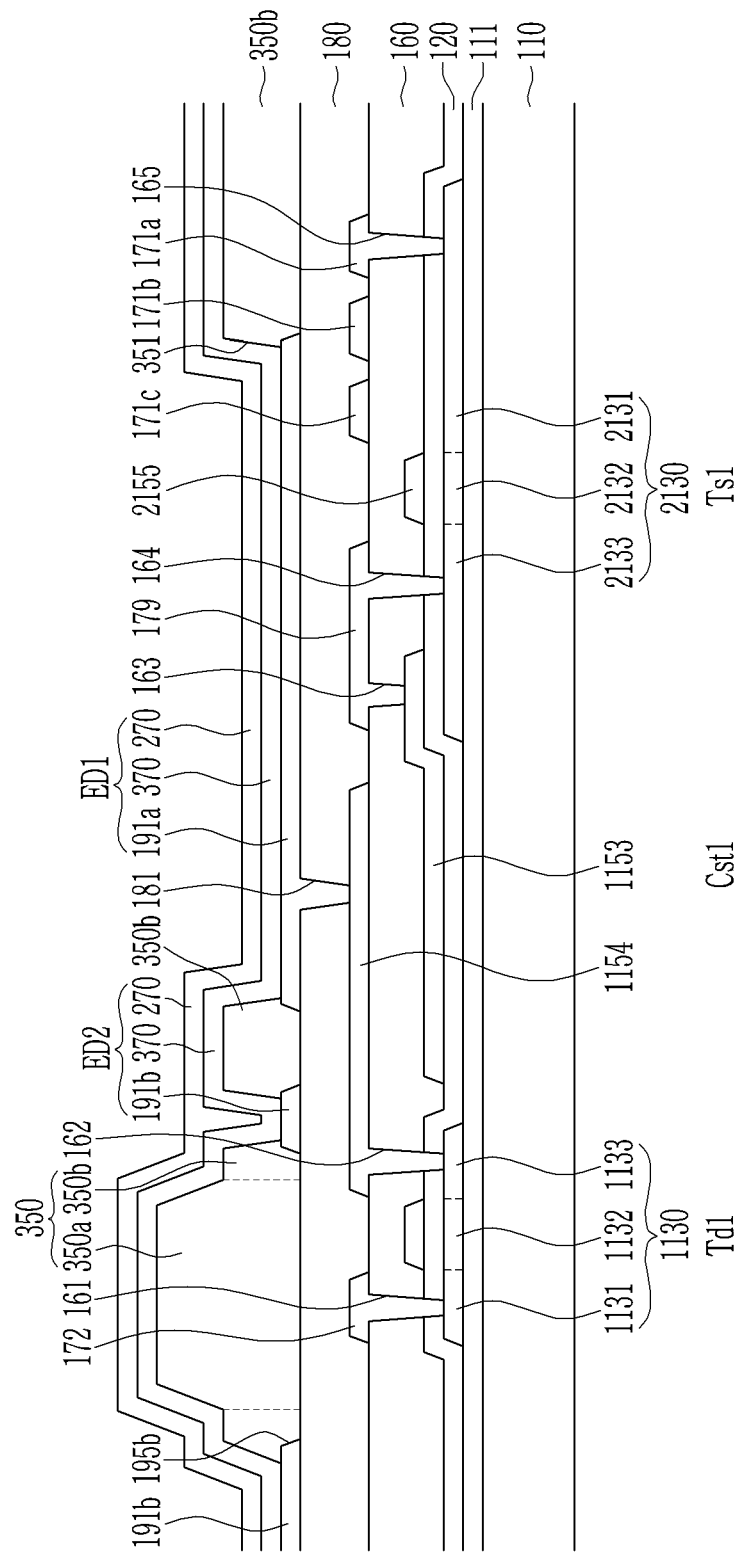
FIG. 12 schematically illustrates a cross-sectional view of a display device according to an embodiment.

Since many portions of a display device according to an embodiment shown in FIG. 12 may be the same as those of a display device according to an embodiment shown in FIG. 1 to FIG. 7, a repeated description thereof will be omitted. An embodiment may differ from other embodiments such that, for example, a thickness of the pixel defining layer may vary in different embodiments, which will be further described below.

FIG. 12 schematically illustrates a cross-sectional view of a display device according to an embodiment.

A display device according to an embodiment may include the substrate 110, the driving transistors Td1, Td2, and Td3 and the switching transistors Ts1, Ts2, and Ts3 of the pixels PX1, PX2, and PX3 disposed on the substrate 110, the pixel electrodes 191a, 191b, and 191c connected to the driving transistors Td1, Td2, and Td3, the emission layer 370 disposed on each of the pixel electrodes 191a, 191b, and 191c, and the common electrode 270 disposed on the emission layer 370.

The second pixel electrode 191b may overlap the driver PXD1 of the first pixel PX1 and the driver PXD2 of the second pixel PX2. The second pixel electrode 191b may include the opening 195b overlapping the driving transistor Td1 of the first pixel PX1. An overlapping area of the second pixel electrode 191b and the driving transistor Td1 of the first pixel PX1 may be reduced by the opening 195b formed in the second pixel electrode 191b.

The pixel defining layer 350 may be disposed on the pixel electrodes 191a, 191b, and 191c and the passivation film 180, and the pixel defining layer 350 may include the pixel opening 351.

In other embodiments, the pixel defining layer 350 may have a constant thickness, while in an embodiment, the pixel defining layer 350 may have different thicknesses according to positions thereof. The thickness of the pixel defining layer 350 may vary in different embodiments. The pixel defining layer 350 may include a first portion 350a overlapping the opening 195b and a second portion 350b excluding the first portion 350a. A thickness of the first portion 350a may be thicker than that of the second portion 350b. The first portion 350a of the pixel defining layer 350 may overlap a portion of the opening 195b. As shown in FIG. 12, the first portion 350a of the pixel defining layer 350 may overlap a central portion of the opening 195b, and a portion of an edge of the opening 195b may overlap the second portion 350b of the pixel defining layer 350. However, embodiments are not limited thereto, and the first portion 350a of the pixel defining layer 350 may overlap the entire opening 195b. In this case, the second part 350b of the pixel defining layer 350 may not overlap the opening 195b.

The emission layer 370 may be disposed on the pixel electrodes 191a, 191b, and 191c and the pixel defining layer 350, and the common electrode 270 may be disposed on the emission layer 370. The pixel defining layer 350 may be disposed between the common electrode 270 and the driving transistor Td1 of the first pixel PX1. In an embodiment, a distance between the common electrode 270 and the driving transistor Td1 of the first pixel PX1 may be increased by forming the first portion 350a of the pixel defining layer 350 overlapping the opening 195b to have a relatively thick thickness. Accordingly, parasitic capacitance formed between the common electrode 270 and the driving transistor Td1 of the first pixel PX1 may be reduced.

Hereinafter, a display device according to an embodiment will be described with reference to FIG. 13 and FIG. 14.

Figure 13:
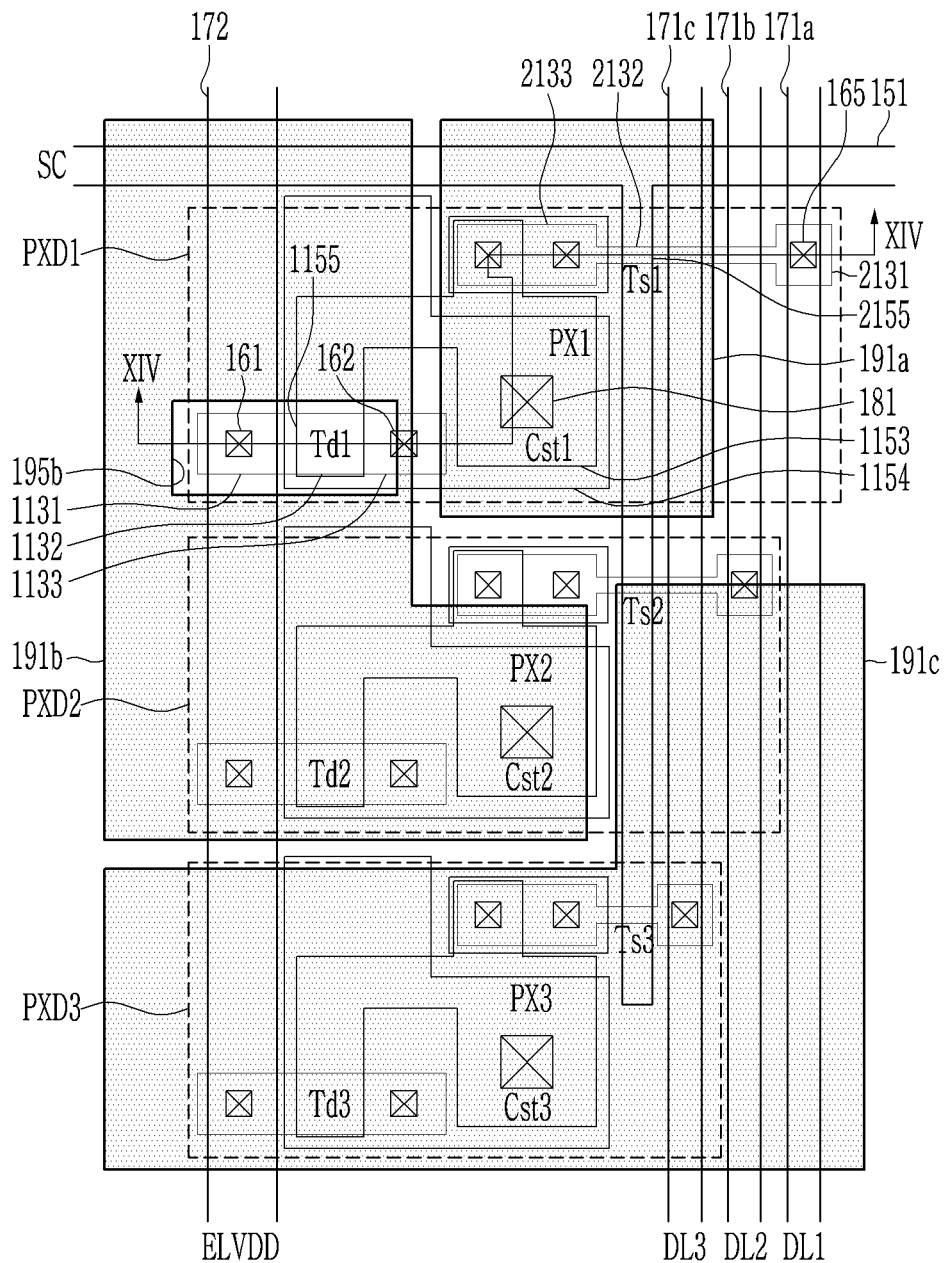
FIG. 13 schematically illustrates a plan view of a display device according to an embodiment.
Figure 14:
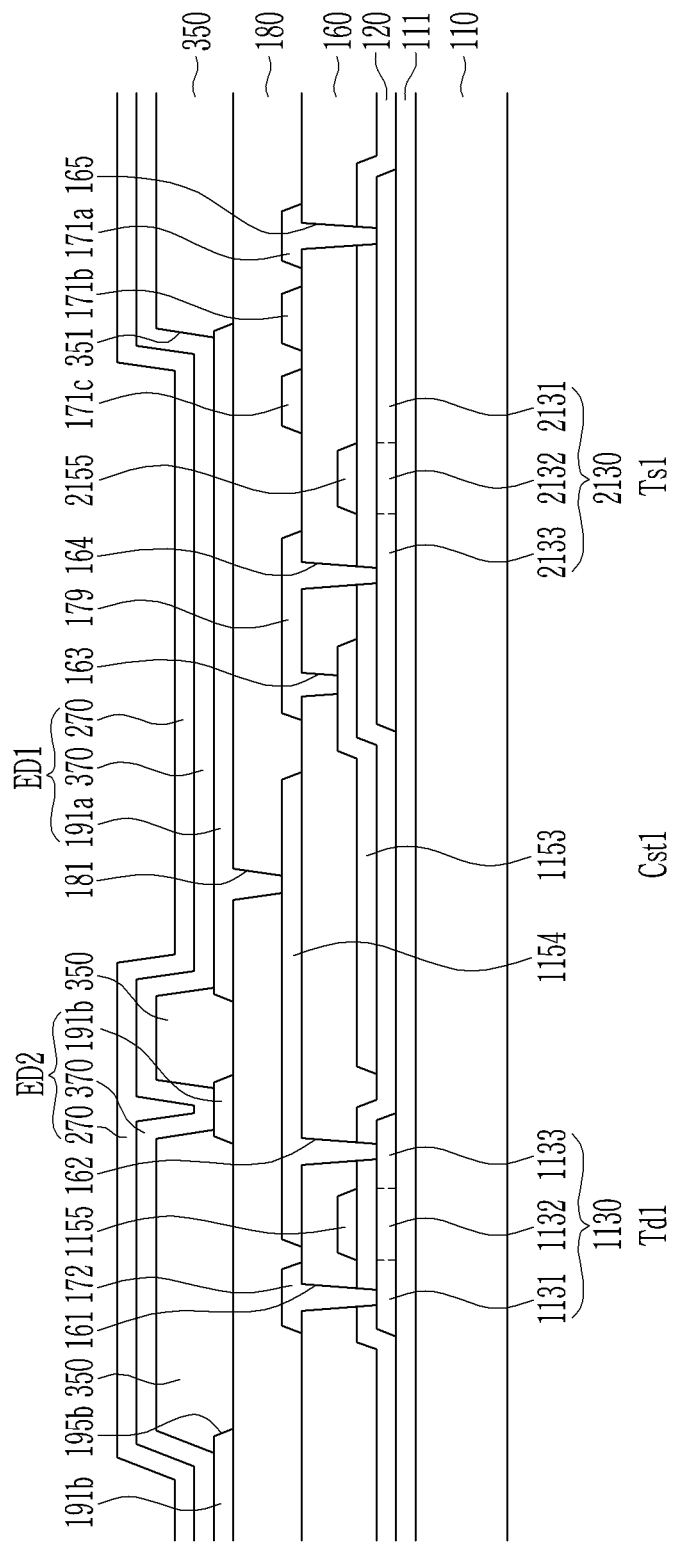
FIG. 14 schematically illustrates a cross-sectional view of a display device taken along line XIV-XIV of FIG. 13.

Since many portions of a display device according to an embodiment shown in FIG. 13 and FIG. 14 may be the same as those of a display device according to an embodiment shown in FIG. 1 to FIG. 7, a repeated description thereof will be omitted. An embodiment may differ from other embodiments in that the upper storage electrode may overlap the gate electrode of the driving transistor, and will be further described below.

FIG. 13 schematically illustrates a plan view of a display device according to an embodiment, and FIG. 14 schematically illustrates a cross-sectional view of a display device taken along line XIV-XIV of FIG. 13.

A display device according to an embodiment may include the substrate 110, the driving transistors Td1, Td2, and Td3 and the switching transistors Ts1, Ts2, and Ts3 of the pixels PX1, PX2, and PX3 disposed on the substrate 110, the pixel electrodes 191a, 191b, and 191c connected to the driving transistors Td1, Td2, and Td3, the emission layer 370 disposed on each of the pixel electrodes 191a, 191b, and 191c, and the common electrode 270 disposed on the emission layer 370.

The second pixel electrode 191b may overlap the driver PXD1 of the first pixel PX1 and the driver PXD2 of the second pixel PX2. The second pixel electrode 191b may include the opening 195b overlapping the driving transistor Td1 of the first pixel PX1. An overlapping area of the second pixel electrode 191b and the driving transistor Td1 of the first pixel PX1 may be reduced by the opening 195b formed in the second pixel electrode 191b.

In other embodiments, the upper storage electrode 1154 may overlap the second region 1133 of the semiconductor layer 1130 of each of the driving transistors Td1, Td2, and Td3, and may not overlap the channel 1132 thereof. For example, the upper storage electrode 1154 may be formed so as to not cover the gate electrode 1155 of each of the driving transistors Td1, Td2, and Td3. In an embodiment, the upper storage electrode 1154 may overlap the channel 1132 and the second region 1133 of the semiconductor layer 1130 of each of the driving transistors Td1, Td2, and Td3. For example, the upper storage electrode 1154 may be formed so as to cover the gate electrode 1155 of each of the driving transistors Td1, Td2, and Td3.

In a display device according to an embodiment, most area of each of the driving transistors Td1, Td2, and Td3 may be covered by the second conductive layer. Accordingly, the influence of the signal applied to the driving transistors Td1, Td2, and Td3 on the other electrode layers disposed on the driving transistors Td1, Td2, and Td3 may be reduced. For example, the influence of the signal applied to the driving transistor Td1 of the first pixel PX1 on the second pixel electrode 191b may be reduced. For example, the parasitic capacitance formed between the second pixel electrode 191b and the first pixel PX1 may be reduced. In addition, since the second pixel electrode 191b overlapping another pixel may include the opening 195b, the parasitic capacitance formed between the second pixel electrode 191b and another pixel may be further reduced.

Hereinafter, a display device according to an embodiment will be described with reference to FIG. 15.

Figure 15:
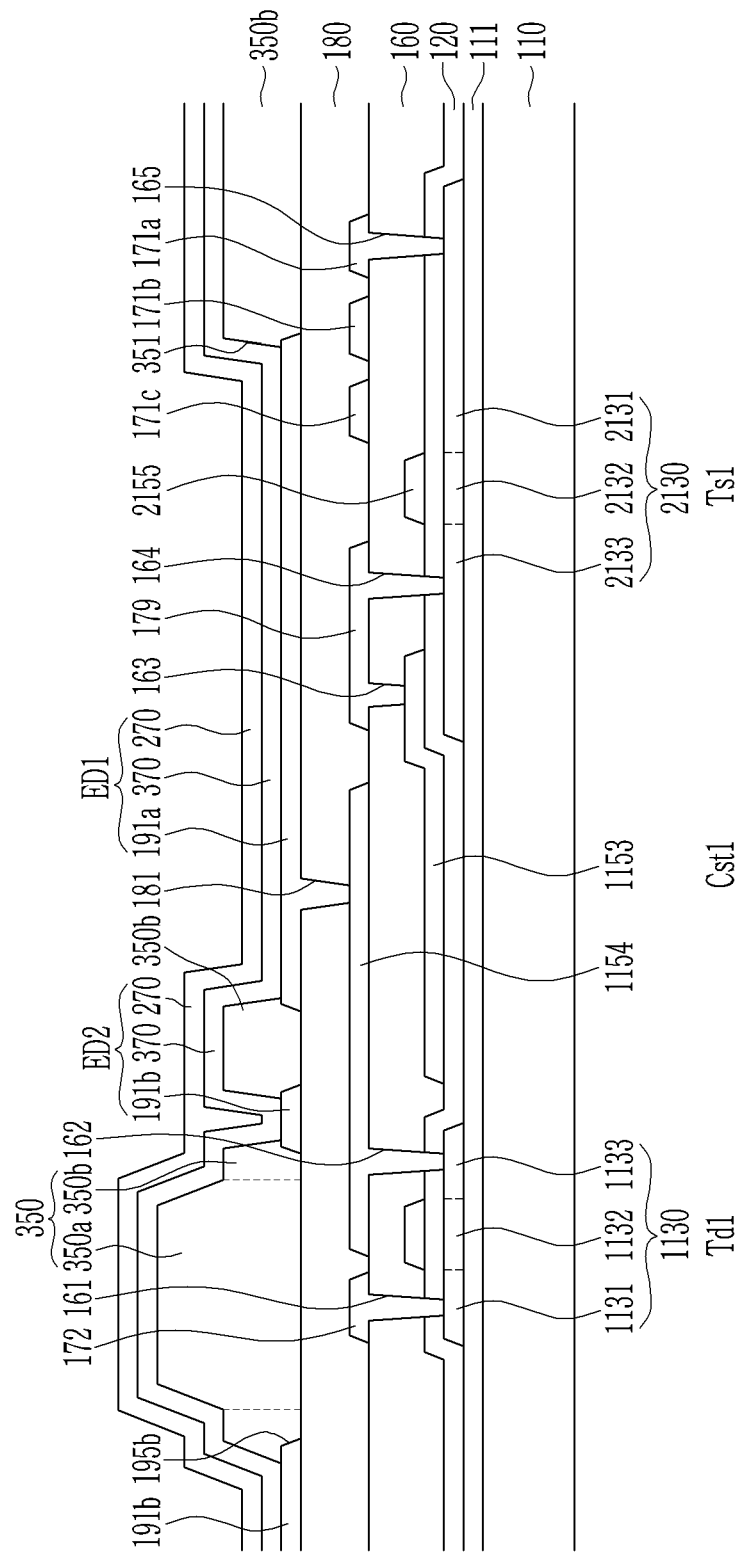
FIG. 15 schematically illustrates a cross-sectional view of a display device according to an embodiment.

Since many portions of a display device according to an embodiment shown in FIG. 15 may be the same as those of a display device according to an embodiment shown in FIG. 13 and FIG. 14, a repeated description thereof will be omitted. An embodiment may differ from other embodiments such that, for example, a thickness of the pixel defining layer may vary in different embodiments, which will be further described below.

FIG. 15 schematically illustrates a cross-sectional view of a display device according to an embodiment.

A display device according to an embodiment may include the substrate 110, the driving transistors Td1, Td2, and Td3 and the switching transistors Ts1, Ts2, and Ts3 of the pixels PX1, PX2, and PX3 disposed on the substrate 110, the pixel electrodes 191a, 191b, and 191c connected to the driving transistors Td1, Td2, and Td3, the emission layer 370 disposed on each of the pixel electrodes 191a, 191b, and 191c, and the common electrode 270 disposed on the emission layer 370.

The second pixel electrode 191b may overlap the driver PXD1 of the first pixel PX1 and the driver PXD2 of the second pixel PX2. The second pixel electrode 191b may include the opening 195b overlapping the driving transistor Td1 of the first pixel PX1. An overlapping area of the second pixel electrode 191b and the driving transistor Td1 of the first pixel PX1 may be reduced by the opening 195b formed in the second pixel electrode 191b.

The upper storage electrode 1154 may overlap the channel 1132 and the second region 1133 of the semiconductor layer 1130 of each of the driving transistors Td1, Td2, and Td3. For example, the upper storage electrode 1154 may be formed so as to cover the gate electrode 1155 of each of the driving transistors Td1, Td2, and Td3.

The pixel defining layer 350 may be disposed on the pixel electrodes 191a, 191b, and 191c and the passivation film 180, and the pixel defining layer 350 may include the pixel opening 351. The pixel defining layer 350 may have different thicknesses according to a position thereof. The pixel defining layer 350 may include the first portion 350a overlapping the opening 195b and the second portion 350b excluding the first portion 350a. A thickness of the first portion 350a may be thicker than that of the second portion 350b. The first portion 350a of the pixel defining layer 350 may overlap a portion or all of the opening 195b.

In an embodiment, the parasitic capacitance formed between the common electrode 270 and the driving transistor Td1 of the first pixel PX1 may be reduced by forming the first portion 350a of the pixel defining layer 350 overlapping the opening 195b to have a relatively thick thickness. In addition, most areas of each of the driving transistors Td1, Td2, and Td3 may be covered by the second conductive layer, so that the influence of the signal applied to the driving transistors Td1, Td2, and Td3 on the other electrode layer disposed on the driving transistors Td1, Td2, and Td3 may be reduced. Further, since the second pixel electrode 191b overlapping another pixel may include the opening 195b, the parasitic capacitance formed between the second pixel electrode 191b and another pixel may be further reduced.

Hereinafter, a display device according to an embodiment will be described with reference to FIG. 16 and FIG. 17.

Figure 16:
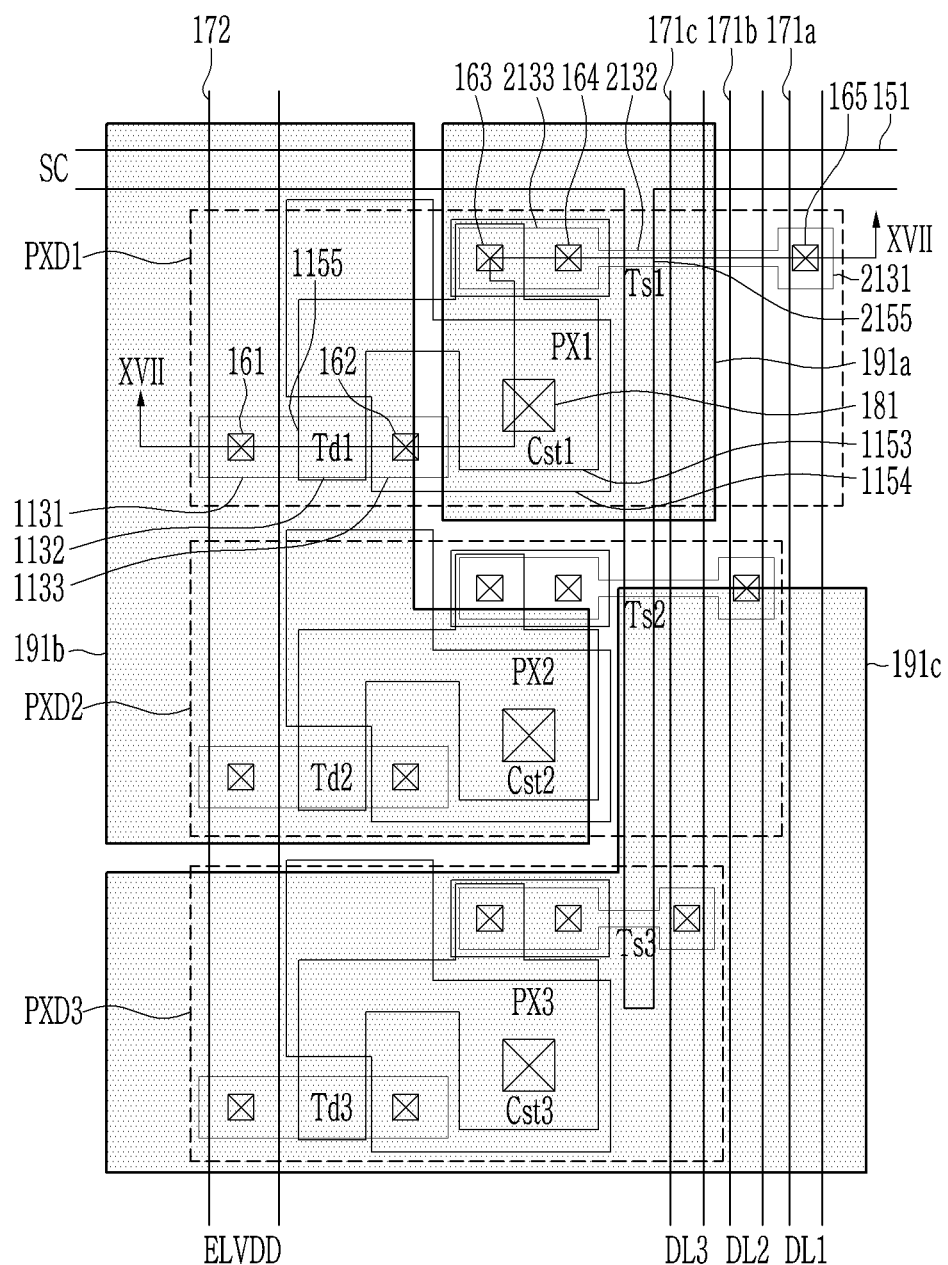
FIG. 16 schematically illustrates a plan view of a display device according to an embodiment.
Figure 17:
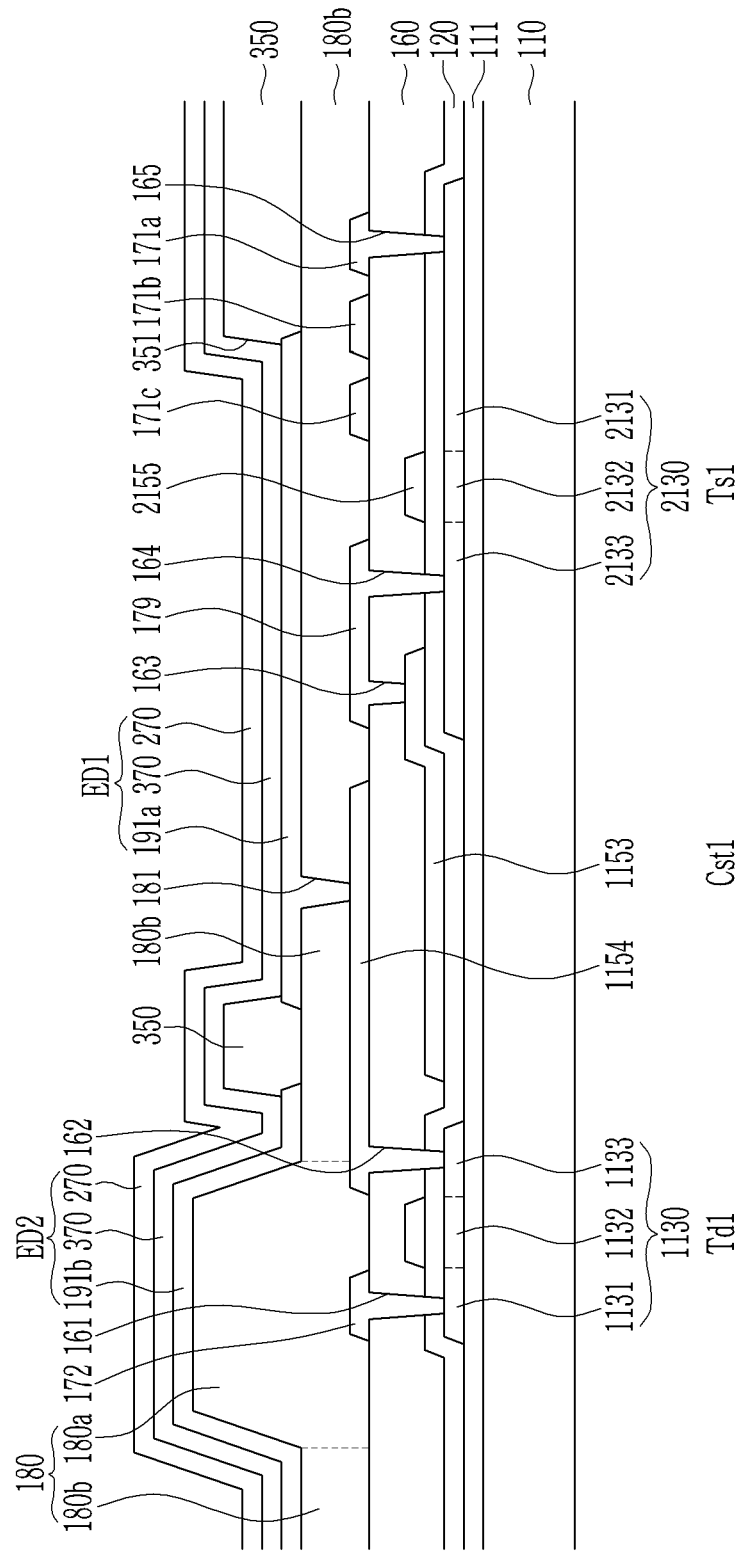
FIG. 17 schematically illustrates a cross-sectional view of a display device taken along line XVII-XVII of FIG. 16.

Since many portions of a display device according to an embodiment shown in FIG. 16 and FIG. 17 may be the same as those of a display device according to an embodiment shown in FIG. 1 to FIG. 7, a repeated description thereof will be omitted. An embodiment may differ from other embodiments in that no opening may be formed in the pixel electrode, and will be further described below.

FIG. 16 schematically illustrates a plan view of a display device according to an embodiment, and FIG. 17 schematically illustrates a cross-sectional view of a display device taken along line XVII-XVII of FIG. 16.

A display device according to an embodiment may include the substrate 110, the driving transistors Td1, Td2, and Td3 and the switching transistors Ts1, Ts2, and Ts3 of the pixels PX1, PX2, and PX3 disposed on the substrate 110, the pixel electrodes 191a, 191b, and 191c connected to the driving transistors Td1, Td2, and Td3, the emission layer 370 disposed on each of the pixel electrodes 191a, 191b, and 191c, and the common electrode 270 disposed on the emission layer 370.

The second pixel electrode 191b may overlap the driver PXD1 of the first pixel PX1 and the driver PXD2 of the second pixel PX2. In other embodiments, the second pixel electrode 191b may include an opening, and in an embodiment, the second pixel electrode 191b may not include an opening. The first pixel electrode 191a and the third pixel electrode 191c may also not include an opening.

The pixel electrodes 191a, 191b, and 191c may be disposed on the passivation film 180. The passivation film 180 may be disposed between the second pixel electrode 191b and the driving transistor Td1 of the first pixel PX1. In other embodiments, the passivation film 180 may have a constant thickness, while in an embodiment, the passivation film 180 may have different thicknesses according to positions thereof. The thickness of the passivation film 180 may vary in different embodiments. The passivation film 180 may include a first portion 180a disposed between the driving transistor Td1 of the first pixel PX1 and the second pixel electrode 191b, and a second portion 180b excluding the first portion 180a. A thickness of the first portion 180a may be thicker than that of the second portion 180b. As shown in FIG. 17, the first portion 180a of the passivation film 180 may overlap a portion of the driving transistor Td1 of the first pixel PX1. However, embodiments are not limited thereto, and the first portion 180a of the passivation film 180 may overlap the entire driving transistor Td1 of the first pixel PX1. In this case, the second portion 180b of the passivation film 180 may not overlap the driving transistor Td1 of the first pixel PX1.

A distance between the second pixel electrode 191b and the driving transistor Td1 of the first pixel PX1 may be increased by forming the first part 180a of the passivation film 180 disposed between the second pixel electrode 191b and the driving transistor Td1 of the first pixel PX1 to have a relatively thick thickness. Accordingly, the parasitic capacitance formed between the second pixel electrode 191b and the driving transistor Td1 of the first pixel PX1 may be reduced.

Hereinafter, a display device according to an embodiment will be described with reference to FIG. 18 and FIG. 19.

Figure 18:
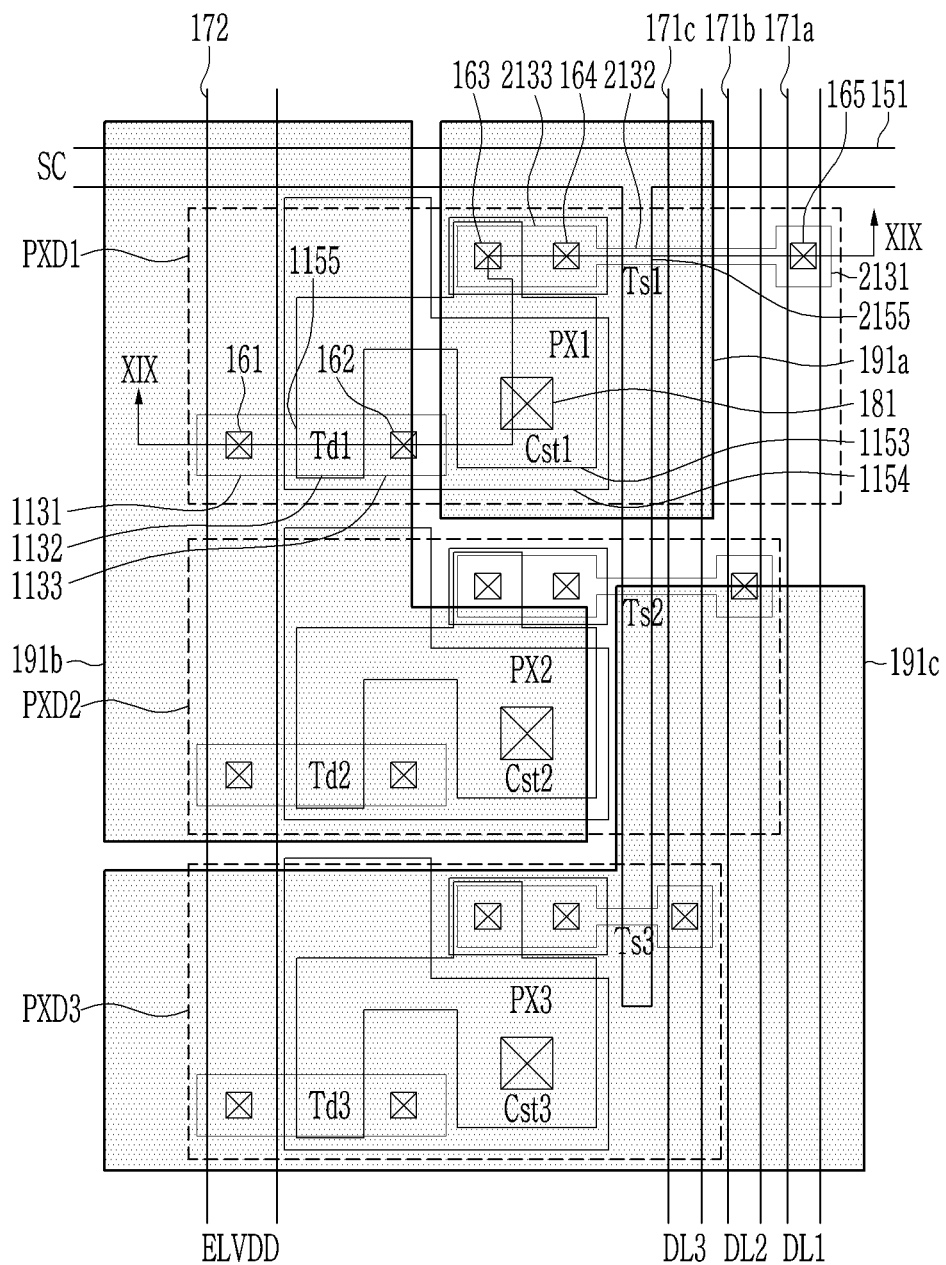
FIG. 18 schematically illustrates a plan view of a display device according to an embodiment.
Figure 19:
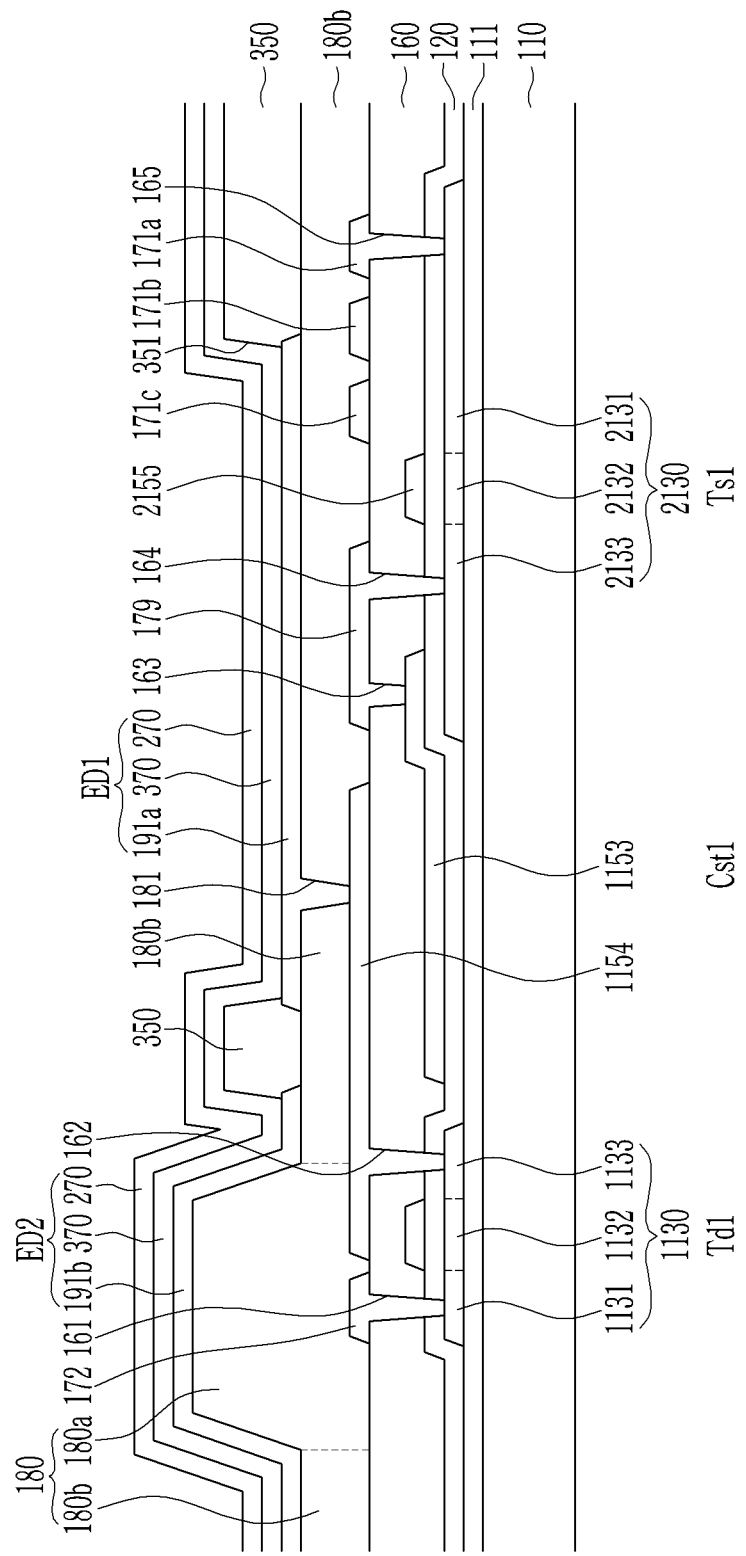
FIG. 19 schematically illustrates a cross-sectional view of a display device taken along line XIX-XIX of FIG. 18.

Since many portions of a display device according to an embodiment shown in FIG. 18 and FIG. 19 may be the same as those of a display device according to an embodiment shown in FIG. 16 and FIG. 17, a repeated description thereof will be omitted. An embodiment may differ from other embodiments in that the upper storage electrode may overlap the gate electrode of the driving transistor, and will be further described below.

FIG. 18 schematically illustrates a plan view of a display device according to an embodiment, and FIG. 19 schematically illustrates a cross-sectional view of a display device taken along line XIX-XIX of FIG. 18.

A display device according to an embodiment may include the substrate 110, the driving transistors Td1, Td2, and Td3 and the switching transistors Ts1, Ts2, and Ts3 of the pixels PX1, PX2, and PX3 disposed on the substrate 110, the pixel electrodes 191a, 191b, and 191c connected to the driving transistors Td1, Td2, and Td3, the emission layer 370 disposed on each of the pixel electrodes 191a, 191b, and 191c, and the common electrode 270 disposed on the emission layer 370.

The second pixel electrode 191b may overlap the driver PXD1 of the first pixel PX1 and the driver PXD2 of the second pixel PX2.

The passivation film 180 may include the first portion 180a disposed between the driving transistor Td1 of the first pixel PX1 and the second pixel electrode 191b and the second portion 180b excluding the first portion 180a. A thickness of the first portion 180a may be thicker than that of the second portion 180b. Accordingly, the parasitic capacitance formed between the second pixel electrode 191b and the driving transistor Td1 of the first pixel PX1 may be reduced.

In other embodiments, the upper storage electrode 1154 may overlap the second region 1133 of the semiconductor layer 1130 of each of the driving transistors Td1, Td2, and Td3, and may not overlap the channel 1132 thereof. For example, the upper storage electrode 1154 may be formed so as to not cover the gate electrode 1155 of each of the driving transistors Td1, Td2, and Td3. In an embodiment, the upper storage electrode 1154 may overlap the channel 1132 and the second region 1133 of the semiconductor layer 1130 of each of the driving transistors Td1, Td2, and Td3. For example, the upper storage electrode 1154 may be formed so as to cover the gate electrode 1155 of each of the driving transistors Td1, Td2, and Td3.

In a display device according to an embodiment, most areas of each of the driving transistors Td1, Td2, and Td3 may be covered by the second conductive layer. Accordingly, the influence of the signal applied to the driving transistors Td1, Td2, and Td3 on the other electrode layers disposed on the driving transistors Td1, Td2, and Td3 may be reduced.

While this disclosure has been described in connection with what is considered to be practical embodiments, it is to be understood that this disclosure is not limited to the disclosed embodiments, but, on the contrary, is intended to cover various modifications and equivalent arrangements.

What is claimed is:

1. A display device comprising:
   a substrate including pixels including a first pixel and a second pixel;
   a driver of the first pixel disposed on the substrate;
   a driver of the second pixel disposed on the substrate;
   a first pixel electrode overlapping the driver of the first pixel and electrically connected to the driver of the first pixel;
   a second pixel electrode overlapping the driver of the first pixel and the driver of the second pixel and electrically connected to the driver of the second pixel;
   an emission layer disposed on the first pixel electrode and the second pixel electrode; and
   a common electrode disposed on the emission layer,
   wherein the second pixel electrode includes a first opening overlapping the driver of the first pixel.

2. The display device of claim 1, wherein
   the driver of each of the first and second pixels includes:
      a driving transistor; and
      a switching transistor electrically connected to the driving transistor, and
   the first opening of the second pixel electrode overlaps the driving transistor of the first pixel.

3. The display device of claim 2, further comprising:
   a driving voltage line disposed on the substrate;
   a first data line disposed on the substrate; and
   a second data line disposed on the substrate, wherein
   the driving transistor of the first pixel and the driving transistor of the second pixel are electrically connected to the driving voltage line,
   the switching transistor of the first pixel is electrically connected to the first data line, and
   the switching transistor of the second pixel is electrically connected to the second data line.

4. The display device of claim 2, wherein
the pixels further include a third pixel,
the display device further includes:
- a driver of the third pixel disposed on the substrate; and
- a third pixel electrode electrically connected to the driver of the third pixel, the second pixel electrode overlaps the driver of the third pixel, and
the second pixel electrode includes a second opening overlapping the driving transistor of the third pixel.

5. The display device of claim 4, wherein the second pixel electrode further includes a third opening overlapping the driving transistor of the second pixel.

6. The display device of claim 2, further comprising:
a passivation film disposed on the driving transistor of the first pixel and the driving transistor of the second pixel; and
a pixel defining layer disposed on the first pixel electrode, the second pixel electrode, and the passivation film,
wherein the pixel defining layer includes a pixel opening overlapping the first pixel electrode and the second pixel electrode.

7. The display device of claim 6, wherein the pixel defining layer is disposed within the opening.

8. The display device of claim 6, wherein the pixel defining layer does not overlap the opening.

9. The display device of claim 6, wherein
the pixel defining layer includes:
- a first portion overlapping the opening; and
- a second portion excluding the first portion, and
a thickness of the first portion is greater than a thickness of the second portion.

10. The display device of claim 2, wherein
the driving transistor of each of the pixels includes:
- a semiconductor layer disposed on the substrate and including a first region, a channel, and a second region, and
- a gate electrode overlapping the channel of the semiconductor layer, and the display device further includes:
- a lower storage electrode extending from the gate electrode of the driving transistor, and
- an upper storage electrode disposed on the lower storage electrode, overlapping the lower storage electrode, and electrically connected to the second region of the semiconductor layer of the driving transistor.

11. The display device of claim 10, wherein the upper storage electrode overlaps the second region of the semiconductor layer of the driving transistor.

12. The display device of claim 11, wherein the upper storage electrode overlaps the gate electrode of the driving transistor.

13. The display device of claim 12, further comprising:
a passivation film disposed on the driving transistor of the first pixel and the driving transistor of the second pixel; and
a pixel defining layer disposed on the first pixel electrode, the second pixel electrode, and the passivation film,
wherein the pixel defining layer includes a pixel opening overlapping the first pixel electrode and the second pixel electrode.

14. The display device of claim 13, wherein the pixel defining layer is disposed within the opening.

15. The display device of claim 13, wherein
the pixel defining layer includes:
- a first portion overlapping the opening; and
- a second portion excluding the first portion, and
a thickness of the first portion is greater than a thickness of the second portion.

16. The display device of claim 1, wherein the first pixel and the second pixel display different colors.

17. A display device comprising:
- a substrate including pixels including a first pixel and a second pixel;
- a driver of the first pixel disposed on the substrate;
- a driver of the second pixel disposed on the substrate;
- a passivation film disposed on the driver of the first pixel and the driver of the second pixel;
- a first pixel electrode disposed on the passivation film, overlapping the driver of the first pixel, and electrically connected to the driver of the first pixel;
- a second pixel electrode disposed on the passivation film, overlapping the driver of the first pixel and the driver of the second pixel, and electrically connected to the driver of the second pixel;
- an emission layer disposed on the first pixel electrode and the second pixel electrode; and
- a common electrode disposed on the emission layer, wherein
the passivation film includes:
- a first portion disposed between the driver of the first pixel and the second pixel electrode; and
- a second portion excluding the first portion, and
a thickness of the first portion is greater than a thickness of the second portion.

18. The display device of claim 17, wherein
the driver of each of the first and second pixels includes:
- a driving transistor; and
- a switching transistor connected to the driving transistor, and
the first portion of the passivation film is disposed between the driving transistor of the first pixel electrode and the second pixel electrode.

19. The display device of claim 18, wherein
the driving transistor of each of the pixels includes:
- a semiconductor layer disposed on the substrate and including a first region, a channel, and a second region, and
- a gate electrode overlapping the channel of the semiconductor layer, and the display device further includes:
- a lower storage electrode extending from the gate electrode of the driving transistor, and
- an upper storage electrode disposed on the lower storage electrode, overlapping the lower storage electrode, and electrically connected to the second region of the semiconductor layer of the driving transistor.

20. The display device of claim 19, wherein the upper storage electrode overlaps the gate electrode of the driving transistor.

* * * * *